United States Patent
Lee

(10) Patent No.: US 9,721,964 B2
(45) Date of Patent: *Aug. 1, 2017

(54) LOW DIELECTRIC CONSTANT INSULATING MATERIAL IN 3D MEMORY

(71) Applicant: Macronix International Co., Ltd., Hsinchu (TW)

(72) Inventor: Guan-Ru Lee, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 103 days.

This patent is subject to a terminal disclaimer.

(21) Appl. No.: 14/297,346

(22) Filed: Jun. 5, 2014

(65) Prior Publication Data

US 2015/0357342 A1    Dec. 10, 2015

(51) Int. Cl.
*H01L 27/115* (2017.01)
*H01L 27/11582* (2017.01)
*H01L 21/28* (2006.01)

(52) U.S. Cl.
CPC .. *H01L 27/11582* (2013.01); *H01L 21/28282* (2013.01)

(58) Field of Classification Search
CPC ......... H01L 27/11521; H01L 27/11551; H01L 27/11578; H01L 27/11597; H01L 27/0688
See application file for complete search history.

(56) References Cited

U.S. PATENT DOCUMENTS

| | | |
|---|---|---|
| 4,881,114 A | 11/1989 | Mohsen et al. |
| 5,801,991 A | 9/1998 | Keeney et al. |
| 5,912,489 A | 6/1999 | Chen et al. |
| 5,991,193 A | 11/1999 | Gallagher et al. |

(Continued)

FOREIGN PATENT DOCUMENTS

| | | |
|---|---|---|
| EP | 1936681 A1 | 6/2008 |
| EP | 2048709 A2 | 4/2009 |

(Continued)

OTHER PUBLICATIONS

"Relative permittivity," Downloaded and redacted on Feb. 4, 2015 from: <http://en.wikipedia.org/wiki/Relative_permittivity> This page was last modified on Jan. 20, 2015, at 06:57, 3 pages.

(Continued)

*Primary Examiner* — Mohsen Ahmadi
*Assistant Examiner* — David Spalla
(74) *Attorney, Agent, or Firm* — Yiding Wu; Haynes Beffel & Wolfeld LLP

(57) ABSTRACT

A memory device includes a plurality of stacks of conductive strips alternating with insulating strips. At least one of the insulating strips includes an insulating material with a dielectric constant equal to or lower than 3.6. A plurality of structures of a conductive material is arranged orthogonally over the stacks. Memory elements are disposed in interface regions at cross-points between side surfaces of the stacks and structures. The insulating strips can have equivalent oxide thicknesses EOT substantially greater than their respective physical thicknesses. The EOT can be at least 10% greater than the respective physical thicknesses. The at least one of the insulating strips can consist essentially of the insulating material with a dielectric constant equal to or lower than 3.6.

22 Claims, 23 Drawing Sheets

(56) References Cited

U.S. PATENT DOCUMENTS

| | | | |
|---|---|---|---|
| 6,034,882 A | 3/2000 | Johnson et al. | |
| 6,323,117 B1 | 11/2001 | Noguchi | |
| 6,906,361 B2 | 6/2005 | Zhang | |
| 6,906,940 B1 | 6/2005 | Lue | |
| 7,005,350 B2 | 2/2006 | Walker et al. | |
| 7,018,783 B2 | 3/2006 | Iwasaki et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,227,783 B2 | 6/2007 | Li | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,433,235 B2 | 10/2008 | Chae et al. | |
| 7,453,729 B2 | 11/2008 | Lee | |
| 7,696,559 B2 | 4/2010 | Arai et al. | |
| 7,851,849 B2 | 12/2010 | Kiyotoshi | |
| 8,289,775 B2 | 10/2012 | Lee et al. | |
| 8,343,871 B2 | 1/2013 | Shih et al. | |
| 8,363,476 B2 | 1/2013 | Lue et al. | |
| 8,383,512 B2 | 2/2013 | Chen et al. | |
| 8,467,219 B2 | 6/2013 | Lue | |
| 8,487,422 B2 | 7/2013 | Dunne | |
| 8,503,213 B2 | 8/2013 | Chen et al. | |
| 8,541,882 B2 | 9/2013 | Chen et al. | |
| 8,598,032 B2 | 12/2013 | Chen et al. | |
| 8,659,944 B2 | 2/2014 | Hung et al. | |
| 8,736,069 B2 | 5/2014 | Chiu et al. | |
| 8,743,624 B2 | 6/2014 | Lutze et al. | |
| 8,759,217 B1 | 6/2014 | Chen | |
| 8,759,899 B1 | 6/2014 | Lue et al. | |
| 8,760,928 B2 | 6/2014 | Chen et al. | |
| 8,970,040 B1 | 3/2015 | Chen | |
| 9,343,322 B2* | 5/2016 | Chen | G11C 7/00 |
| 2004/0023499 A1 | 2/2004 | Hellig et al. | |
| 2004/0124466 A1 | 7/2004 | Walker et al. | |
| 2004/0188822 A1 | 9/2004 | Hara | |
| 2005/0280061 A1 | 12/2005 | Lee | |
| 2007/0045708 A1 | 3/2007 | Lung | |
| 2007/0090434 A1 | 4/2007 | Davies et al. | |
| 2007/0140001 A1 | 6/2007 | Motoi et al. | |
| 2007/0231750 A1 | 10/2007 | Parikh | |
| 2007/0252201 A1 | 11/2007 | Kito et al. | |
| 2007/0253233 A1 | 11/2007 | Mueller et al. | |
| 2008/0048237 A1 | 2/2008 | Iwata | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0106931 A1 | 5/2008 | Toda | |
| 2008/0170429 A1 | 7/2008 | Bertin et al. | |
| 2008/0175032 A1 | 7/2008 | Tanaka et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0001530 A1 | 1/2009 | Goto | |
| 2009/0032966 A1 | 2/2009 | Lee et al. | |
| 2009/0097321 A1 | 4/2009 | Kim et al. | |
| 2009/0184360 A1 | 7/2009 | Jin et al. | |
| 2009/0283819 A1* | 11/2009 | Ishikawa | H01L 21/28282 257/324 |
| 2010/0007001 A1 | 1/2010 | Wang et al. | |
| 2010/0054015 A1 | 3/2010 | Lee et al. | |
| 2010/0109164 A1 | 5/2010 | Kang et al. | |
| 2010/0133645 A1 | 6/2010 | Dunne | |
| 2010/0178755 A1* | 7/2010 | Lee | H01L 27/11551 438/479 |
| 2010/0182041 A1 | 7/2010 | Feng et al. | |
| 2010/0225000 A1 | 9/2010 | Sugizaki et al. | |
| 2010/0226195 A1 | 9/2010 | Lue | |
| 2010/0270593 A1 | 10/2010 | Lung et al. | |
| 2011/0031630 A1 | 2/2011 | Hashimoto | |
| 2011/0057321 A1 | 3/2011 | Wang et al. | |
| 2011/0069524 A1 | 3/2011 | Toba et al. | |
| 2011/0116309 A1 | 5/2011 | Lung | |
| 2011/0235398 A1 | 9/2011 | Hosono | |
| 2011/0235408 A1 | 9/2011 | Minemura et al. | |
| 2011/0292738 A1 | 12/2011 | Hsu et al. | |
| 2011/0305088 A1 | 12/2011 | Huang et al. | |
| 2012/0007167 A1 | 1/2012 | Hung et al. | |
| 2012/0051137 A1 | 3/2012 | Hung et al. | |
| 2012/0068241 A1 | 3/2012 | Sakuma et al. | |
| 2012/0081958 A1* | 4/2012 | Lee | G11C 16/0483 365/185.05 |
| 2012/0115309 A1 | 5/2012 | Yoo et al. | |
| 2012/0119283 A1 | 5/2012 | Lee et al. | |
| 2012/0182802 A1 | 7/2012 | Hung et al. | |
| 2012/0182806 A1* | 7/2012 | Chen | H01L 27/11573 365/185.17 |
| 2012/0281471 A1 | 11/2012 | Hung et al. | |
| 2012/0327714 A1 | 12/2012 | Lue | |
| 2013/0082341 A1 | 4/2013 | Shimizu et al. | |
| 2013/0088920 A1 | 4/2013 | Huang et al. | |
| 2013/0341797 A1 | 12/2013 | Lim | |
| 2014/0053979 A1 | 2/2014 | Chen et al. | |
| 2014/0198576 A1 | 7/2014 | Hung et al. | |
| 2015/0009757 A1 | 1/2015 | Hu et al. | |

FOREIGN PATENT DOCUMENTS

| | | |
|---|---|---|
| EP | 2192612 A2 | 6/2010 |
| TW | I308374 B | 4/2009 |
| TW | 201123266 A | 7/2011 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jan. 12-14, 2012, pp. 91-92.

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Choi, et al. "Investigation of Gate-Induced Drain Leakage (GIDL) Current in Thin Body Devices: Single-Gate Ultra-Thin Body, Symmetrical Double-Gate, and Assymmetrical Double-Gate MOSFETs," Jpn. J. Appl. Phys. vol. 42, Apr. 2003, pp. 2073-2076.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, Jun. 13-18, 2010, pp. 350-355.

Hubert et al., "A Stacked SONOS Technology, Up to 4 Levels and 6nm Crystalline Nanowires, With Gate-All-Around or Independent Gates (FLASH), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

(56) References Cited

OTHER PUBLICATIONS

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and Pipe (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 14/038,526, "Contact Structure and Forming Method", filed Sep. 26, 2013, 69 pages.

Wang H-H et al., "A New Read-Disturb Failure Mechanism Caused by Boosting Hot-Carrier Injection Effect in MLC NAND Flash Memory," IEEE International Memory Workshop, 2009, May 10-14, 2009, pp. 1-2.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

Extended European Search Report for EP 12170759, dated Feb. 5, 2013, 12 pages.

Paul et al., "Impact of a Process Variation on Nanowire and Nanotube Device Performance," IEEE Trans. on Electron Devices, vol. 54, No. 9, Sep. 2007, pp. 2369-2376.

\* cited by examiner

LOW DIELECTRIC CONSTANT INSULATING MATERIAL IN 3D MEMORY

BACKGROUND

Field of the Invention

The present invention relates to high density memory devices, and particularly to memory devices in which multiple planes of memory cells are arranged to provide a three-dimensional 3D array.

Description of Related Art 3D memory devices have been developed in a variety of configurations that include vertical gate structures and vertical channel structures. In vertical gate structures, memory cells including charge storage structures are disposed at interface regions between horizontal planes of active strips including channels for the memory cells, and vertical conductive strips arranged as word lines, string select lines, and ground select lines. In vertical channel structures, memory cells including charge storage structures are disposed at interface regions between horizontal planes of conductive strips arranged as word lines, string select lines, and ground select lines, and vertical active strips including channels for the memory cells. Stacks of active strips in the vertical gate structures are separated by insulating material in a Z-direction, and so are stacks of conductive strips in the vertical channel structures. Thicker insulating material can reduce channel-to-channel interference in the Z-direction between active strips in the vertical gate structures, or reduce gate-to-gate interference in the Z-direction between conductive strips in the vertical channel structures. However, thicker insulating material can also increase the height of the stacks, result in higher aspect ratio of a height over a width of vias or openings in the stacks, and thus cause process issues such as bending.

It is desirable to provide a structure for three-dimensional integrated circuit memory that can reduce the height of the stacks without degrading the device performance, or reduce the Z-direction interference without increasing the height of the stacks.

SUMMARY

A memory device includes a plurality of stacks of conductive strips alternating with insulating strips. At least one of the insulating strips includes an insulating material with a dielectric constant equal to or lower than 3.6. The at least one of the insulating strips can consist essentially of the insulating material with a dielectric constant equal to or lower than 3.6. As a result, the equivalent oxide thickness EOT of at least one of the insulating strips is greater than its respective physical thickness. A plurality of structures of a conductive material is arranged orthogonally over the plurality of stacks. Memory elements are disposed in interface regions at cross-points between side surfaces of the plurality of stacks and the plurality of structures.

As used in the present specification, the dielectric constant of a material is the permittivity of the material divided by the permittivity of vacuum and can be referred to as static relative permittivity. The deposition of a single insulating material layer results in formation of an insulating layer consisting essentially of the single insulating material. The insulating layer can comprise multiple layers, one or more of which consists essentially of a single low-K material, where K refers to the dielectric constant as used in the present specification, and the single low-K material can have a dielectric constant lower than that of silicon dioxide in between other layers.

The insulating strips can comprise one or more low dielectric constant materials of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora. The materials in this group have dielectric constants equal to or lower than the dielectric constant of SiOF, which is about 3.6, and higher than dielectric constants of other materials in the group. For instance, the dielectric constant of SiOC is about 2.9, the dielectric constant of P-MSQ is about 2.3, the dielectric constant of SILK is about 2.6 to 2.8, the dielectric constant of black diamond is about 2.6 to 3.0, and the dielectric constant of coral is about 2.7 to 2.9. In some embodiments the insulating strips can be a single layer that consists essentially of a low dielectric constant insulator, such as one of those mentioned above. Alternatively, the insulating strips can be multilayer strips which in combination have an EOT that is greater than the physical thickness of the strips.

The EOT of the insulating strips should be high enough that the insulating requirements of the structure are met, and substantially greater than their physical thicknesses, such that the depth of the stack can be kept within process limitations for high aspect ratio etch processes. The EOT can be at least 10% greater than the physical thickness utilizing the materials listed above.

The stacks of conductive strips alternating with insulating strips can have non-simple spatial periods through the conductive strips and insulating strips in the stacks. Conductive strips in the stacks of conductive strips can include un-doped poly silicon.

The memory device can include a stack of linking elements separated by insulating layers, where the linking elements can be connected to respective conductive strips in the stacks of conductive strips. The memory device can include a plurality of interlayer connectors in the stack of linking elements extending from a connector surface to respective linking elements, and patterned conductor lines on top of the connector surface and connected to respective interlayer connectors.

In one implementation, the patterned conductor lines can include a plurality of global bit lines coupled to sensing circuits. Conductive strips in the stacks of conductive strips can include channels for the memory elements, and structures in the plurality of structures can be arranged as word lines and string select lines including vertical gates for the memory elements.

In an alternative implementation, the patterned conductor lines can be coupled to decoding circuits. Conductive strips in the stacks of conductive strips can be arranged as word lines and string select lines including gates for the memory elements, and structures in the plurality of structures can be arranged as vertical channels for the memory elements.

In either implementation, the stack of linking elements separated by insulating layers can have non-simple spatial periods through linking elements and insulating layers in the stack of linking elements.

Methods for manufacturing memory devices as described herein are also provided. In one implementation, a plurality of conductive layers alternating with insulating layers are formed on an integrated circuit substrate, where at least one of the insulating layers have equivalent oxide thicknesses EOT substantially greater than their respective physical thicknesses. The plurality of conductive layers alternating with insulating layers can have non-simple spatial periods through the conductive layers and insulating layers in the plurality. Consequently, stacks of conductive strips alternating with insulating strips etched from the plurality of conductive layers and insulating layers can have non-simple spatial periods through the conductive strips and insulating strips in the stacks, and a stack of linking elements etched from the plurality of conductive layers and insulating layers can have non-simple spatial periods through linking elements and insulating layers in the stack.

In one implementation to manufacture a memory device in a vertical channel structure, a plurality of sacrificial layers, separated by the insulating layers on the integrated circuit substrate, can be formed. The sacrificial and the insulating layers can be etched to form first openings. A plurality of vertical conductive strips can be formed in the first openings. The sacrificial and the insulating layers can be etched to form second openings between adjacent vertical conductive strips in the plurality of vertical conductive strips, thereby exposing the plurality of sacrificial layers. The plurality of sacrificial layers exposed by the second openings can be removed to form horizontal openings between the insulating layers. A memory layer is formed on side surfaces of the vertical conductive strips in the horizontal openings. A plurality of planes of conductive strips can be formed in the horizontal openings, where side surfaces of conductive strips in the plurality of planes contact the memory layer. The plurality of sacrificial layers can include silicon nitride.

Other aspects and advantages of the present invention can be seen on review of the drawings, the detailed description and the claims, which follow.

DETAILED DESCRIPTION

Figure 1:
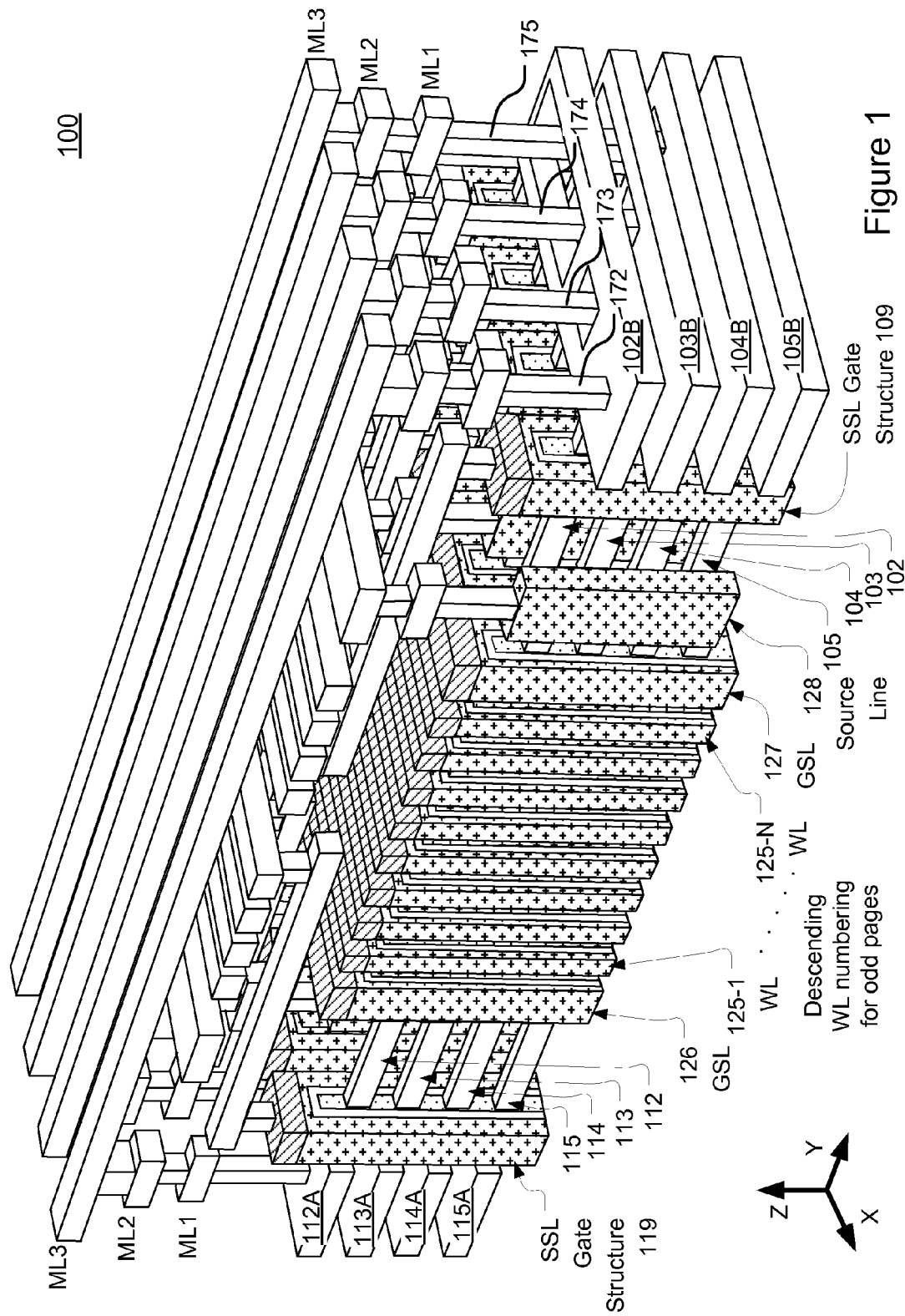
FIG. 1 is a perspective illustration of an implementation of a three-dimensional (3D) integrated circuit device using a vertical gate structure.

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective illustration of an implementation of a three-dimensional (3D) integrated circuit device using a vertical gate structure. The device 100 illustrated in FIG. 1 includes a plurality of stacks of conductive strips alternating with insulating strips in the Z-direction on an integrated circuit substrate. At least one of the insulating strips includes an insulating material with a dielectric constant lower than that of silicon dioxide, which is about 3.9. As a result, the equivalent oxide thickness EOT of at least one of the insulating strips is greater than its physical thickness. The insulating strips can comprise an insulating material with a dielectric constant equal to or lower than 3.6, such as the dielectric constant of SiOF (fluorinated silicate glass). The insulating material is one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora.

As used in the present specification, a low dielectric constant refers to a dielectric constant lower than that of silicon dioxide, which is about 3.9. In one implementation, the insulating strips with a low dielectric constant can induce a same amount of interference as, and are thinner than, insulating strips consisting essentially of silicon dioxide, where the interference is on conductive strips adjacent to the insulating strips in the plurality of stacks. In an alternative implementation, the insulating strips with a low dielectric constant can have a same thickness as, and induce less amount of interference than, insulating strips consisting essentially of silicon dioxide, where the interference is on conductive strips adjacent to the insulating strips in the plurality of stacks.

In yet another implementation, the insulating strips with a low dielectric constant can be thinner than, and induce less amount of interference than, insulating strips consisting essentially of silicon dioxide, where the interference is on conductive strips adjacent to the insulating strips in the plurality of stacks.

As used in the present application, the term "equivalent oxide thickness". abbreviated as EOT, means that by using insulating materials with different dielectric constants, the physical thicknesses of the insulating materials can be designed for the same electrical performance as when using SiO2. For instance, an insulating layer can be designed using silicon dioxide (SiO2) with a particular thickness, or can be designed with a thinner thickness using an insulating material with a dielectric constant lower than that of SiO2, to achieve the same electrical performance as when using SiO2 with the particular thickness.

Table 1 shows example stack height reduction corresponding to physical oxide thicknesses of insulating materials:

TABLE 1

Stack Height Reduction

| | k | Physical thickness | Stack Height Reduction for 8 OP | Stack Height Reduction for 16 OP |
|---|---|---|---|---|
| SiO2 | 3.9 | 45 nm | 0 | 0 |
| SiOF | 3.6 | 41.5 nm | 28 nm | 56 nm |
| SiOC | 2.9 | 33.5 nm | 92 nm | 184 nm |
| SOD | 2.3 | 26.5 nm | 148 nm | 296 nm |

Stack height reduction using low-k dielectric materials is compared to the height of a stack of conductive strips alternating with insulating strips where the insulating strips include SiO2 (silicon dioxide) with a dielectric constant (k) of about 3.9. The thickness of each insulating strip including SiO2 is about 45 nm (nanometer). For instance, if the insulating strips include SiOF (fluorinated silicate glass) with a dielectric constant (k) of about 3.6, then the physical oxide thickness of each insulating strip can be reduced from about 45 nm to about 41.5 nm, and consequently a stack height for 8 conductive strips alternating with insulating strips (8 OP) can be reduced by 28 nm, and a stack height for 16 conductive strips alternating with insulating strips (16 OP) can be reduced by 56 nm. If the insulating strips include SiOC (carbonated silicate glass) with a dielectric constant (k) of about 2.9, then the physical oxide thickness of each insulating strip can be reduced from about 45 nm to about 33.5 nm, and consequently a stack height for 8 conductive strips alternating with insulating strips (8 OP) can be reduced by 92 nm, and a stack height for 16 conductive strips alternating with insulating strips (16 OP) can be reduced by 184 nm. If the insulating strips include SOD (Spin-On Dielectric) with a dielectric constant (k) of about 2.3, then the physical oxide thickness of each insulating strip can be reduced from about 45 nm to about 26.5 nm, and consequently a stack height for 8 conductive strips alternating with insulating strips (8 OP) can be reduced by 148 nm, and a stack height for 16 conductive strips alternating with insulating strips (16 OP) can be reduced by 296 nm.

Accordingly, using low-k dielectric materials, such as SiOC, can reduce thicknesses of insulating layer and consequently reduce heights of stacks including conductive strips alternating with insulating strips of reduced thicknesses, while inducing a similar amount of interference as insulating strips consisting essentially of SiO2.

One factor to consider in using low-k dielectric materials for insulating strips is the field strength relative to the breakdown field strength. The breakdown field strength for an insulating material is the maximum electric field that the insulating material can withstand without experiencing failure of its insulating properties. Table 2 shows example field strengths corresponding to physical oxide thicknesses of insulating materials:

TABLE 2

Field Strengths

| | k | Physical thickness | Field Strength at 9 V |
|---|---|---|---|
| SiO2 | 3.9 | 45 nm | 2 MV/cm |
| SiOF | 3.6 | 41.5 nm | 2.2 MV/cm |
| SiOC | 2.9 | 33.5 nm | 2.7 MV/cm |
| SOD | 2.3 | 26.5 nm | 3.4 MV/cm |

If the insulating strips consist essentially of SiOC (carbonated silicate glass) with a dielectric constant (k) of about 2.9, then the physical oxide thickness of each insulating strip can be reduced from about 45 nm to about 33.5 nm. As the physical oxide thickness of the insulating strips is reduced, the field strength on the insulating strips increases. When the physical oxide thickness is reduced to about 33.5 nm from 45 nm, the field strength at 9V self-boosting channel potential can be increased to about 2.7 MV/cm from 2 MV/cm for the thickness of 45 nm. The breakdown field strength for SiOC is about 6 MV/cm, and therefore the field strength of 2.7 MV/cm for SiOC is safely lower than the breakdown field strength of 6 MV/cm for SiOC.

Dielectric materials, including low-k dielectric materials, may have non-zero conductivity and thus allowing an undesired leakage current to flow slowly. SiOC can have an acceptable low leakage current below $1.0 \times 10^{-10}$ A/cm$^2$ at 1.0 MV/cm, or about $7 \times 10^{-12}$ A @ 3.35V for a plane of insulating strips.

The film stress of SiOC can be changed from compressive to tensile after annealing and increases with carbon contents in SiOC. This mechanical property can be beneficial to avoid bending of conductive strips alternating with insulating strips consisting essentially of SiO2.

Insulating materials, including insulating materials with low dielectric constants, are removed from the drawing to expose additional structure. For example, insulating strips are removed between the conductive strips in the stacks in the Z-direction, and are removed between the stacks of conductive strips in the X-direction. This structure is described herein in some detail, as an example of a three-dimensional (3D) memory array which can be manufactured on a semiconductor substrate, in combination with peripheral circuits on the substrate (not shown). Other multilayer circuit structures can also be formed using the technology described herein.

In the example shown in FIG. 1, a multilayer array is formed on an insulating layer, and includes a plurality of structures of a conductive material, such as a plurality of word lines 125-1 WL through 125-N WL, arranged orthogonally over and conformal with the plurality of stacks. Conductive strips in the stacks of conductive strips in multiple planes (e.g. 112, 113, 114, and 115) can include channels for the memory elements, and structures in the plurality of structures (e.g. 125-1 WL through 125-N WL) can be arranged as word lines and string select lines including vertical gates for memory elements. Conductive strips in the same plane are electrically coupled together by a stack of linking elements (e.g. 102B, 103B, 104B and 105B).

A contact structure including a stack of linking elements 112A, 113A, 114A, and 115A terminate conductive strips, such as the conductive strips 112, 113, 114, and 115 in the plurality of stacks. As illustrated, these linking elements 112A, 113A, 114A, and 115A are electrically connected to different bit lines for connection to decoding circuitry to select planes within the array. These linking elements 112A, 113A, 114A, and 115A can be patterned at the same time that the plurality of stacks is defined.

The stack of linking elements (e.g. 102B, 103B, 104B and 105B) are separated by insulating layers (not shown) in the Z-direction, and terminate conductive strips, such as conductive strips 102, 103, 104, and 105. The insulating layers can include the insulating material as described for the insulating strips between the conductive strips in the Z-direction. A plurality of interlayer connectors (e.g. 172, 173, 174, and 175) in the stack of linking elements (e.g. 102B, 103B, 104B, and 105B) extend from a connector surface to respective linking elements. Patterned conductor lines on top of the connector surface can be connected to respective interlayer connectors. As illustrated, interlayer connectors 172, 173, 174, 175 electrically connect linking elements 102B, 103B, 104B, and 105B to different bit lines in patterned conductor lines, such as a metal layer ML3, in connection to decoding circuitry to select planes within the array. The stack of linking elements 102B, 103B, 104B, and 105B can be patterned at the same time that the plurality of stacks is defined.

Any given stack of conductive strips is coupled to either the stack of linking elements 112A, 113A, 114A, and 115A, or the stack of linking elements 102B, 103B, 104B, and 105B, but not both. The stack of conductive strips 112, 113, 114, and 115 is terminated at one end by the stack of linking elements 112A, 113A, 114A, and 115A, passes through SSL gate structure 119, ground select line GSL 126, word lines 125-1 WL through 125-N WL, ground select line GSL 127, and is terminated at the other end by source line 128. The stack of conductive strips 112, 113, 114, and 115 does not reach the stack of linking elements 102B, 103B, 104B, and 105B.

The stack of conductive strips 102, 103, 104, and 105 is terminated at one end by the stack of linking elements 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of conductive strips 102, 103, 104, and 105 does not reach the stack of linking elements 112A, 113A, 114A, and 115A.

A memory layer is disposed in interface regions at cross-points between surfaces of the conductive strips 112-115 and 102-105 in the plurality of stacks of conductive strips, and the plurality of structures of a conductive material, such as a plurality of word lines 125-1 WL through 125-N WL. In particular, the memory layer is formed on side surfaces of the conductive strips in the plurality of stacks. Memory elements are disposed in interface regions at cross-points between side surfaces of the plurality of stacks and the plurality of word lines. Ground select lines GSL 126 and GSL 127 are conformal with the plurality of stacks, similar to the word lines.

Every stack of conductive strips is terminated at one end by linking elements and at the other end by a source line. For example, the stack of conductive strips 112, 113, 114, and 115 is terminated at one end by linking elements 112A, 113A, 114A, and 115A, and terminated on the other end by a source line 128. At the near end of the figure, every other stack of conductive strips is terminated by the linking elements 102B, 103B, 104B, and 105B, and every other stack of conductive strips is terminated by a separate source line. At the far end of the figure, every other stack of conductive strips is terminated by the linking elements 112A, 113A, 114A, and 115A, and every other stack of conductive strips is terminated by a separate source line.

Bit lines and string select gate structures are formed at the metals layers ML1, ML2, and ML3. Bit lines are coupled to a plane decoder (not shown). String select gate structures are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

Figure 2:
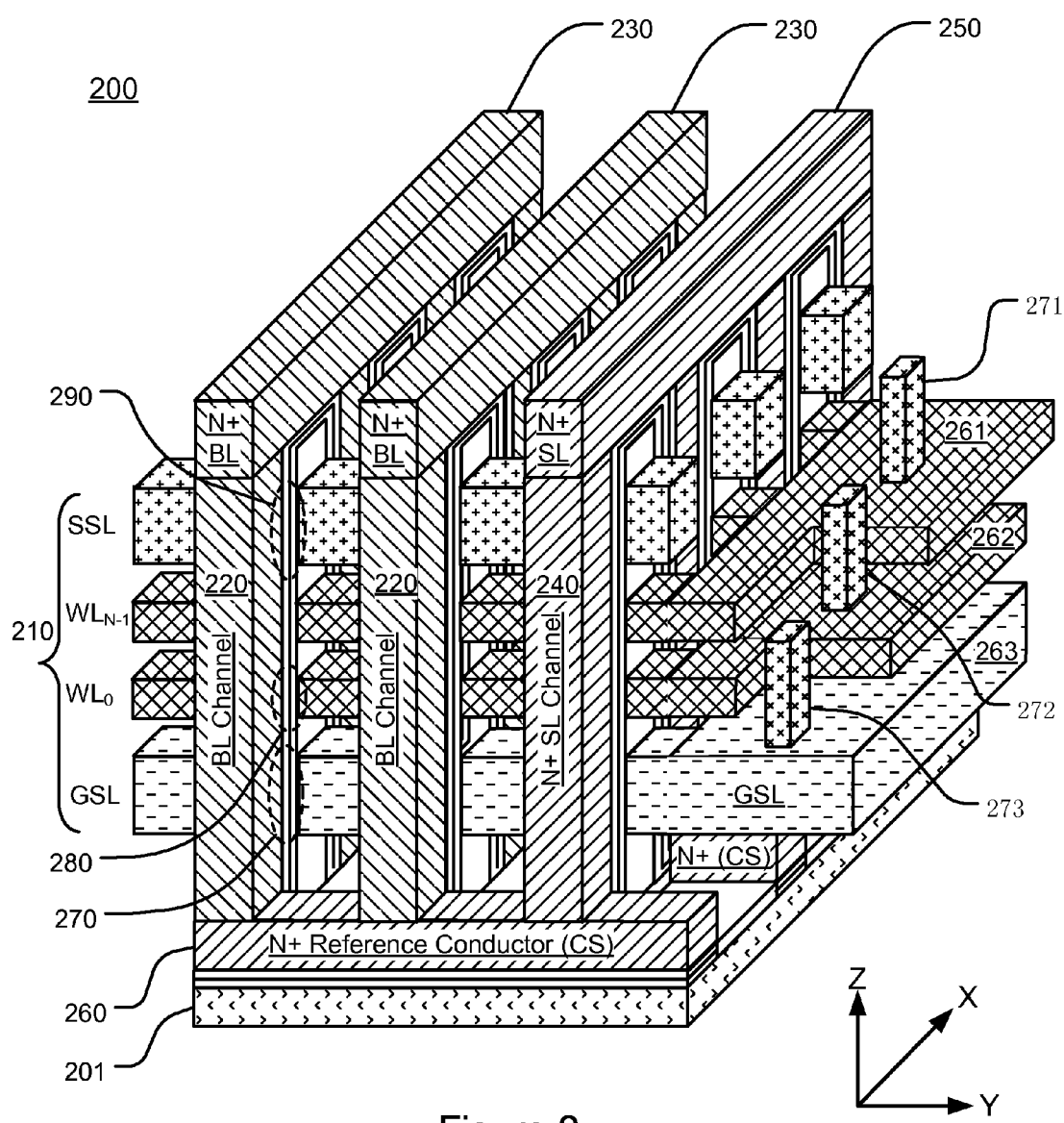
FIG. 2 is a perspective illustration of an implementation of a three-dimensional (3D) integrated circuit device using a vertical channel structure.

FIG. 2 is a perspective illustration of an implementation of a three-dimensional (3D) integrated circuit device using a vertical channel structure. A device 200 illustrated in FIG. 2 includes a plurality of stacks of conductive strips alternating with insulating strips in the Z-direction on an integrated circuit substrate. At least one of the insulating strips includes an insulating material with a dielectric constant lower than that of silicon dioxide ($SiO_2$), which is about 3.9. As a result, the equivalent oxide thickness EOT of at least one of the insulating strips is greater than its physical thickness. Insulating strips in the vertical channel structure as described in connection with FIG. 2 include the insulating material as described for the insulating strips in the vertical gate structure as described in connection with FIG. 1. Insulating materials, including insulating materials with low dielectric constants, are removed in FIG. 2 to expose additional structure, as also removed in FIG. 1.

As illustrated in the example of FIG. 2, the memory device 200 includes a plurality of stacks of conductive strips alternating with insulating strips on an integrated circuit substrate (not shown). The plurality of stacks of conductive strips is arranged as at least a bottom plane of conductive strips (GSL), a plurality of intermediate planes of conductive strips (WLs), and a top plane of conductive strips (SSLs), including gates for the memory elements. In the example shown in FIG. 2, a stack 210 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. The conductive strips can comprise a variety materials including doped semiconductors, metals, and conductive compounds like Si, Ge, SiGe, SiC, TiN, TaN, W, and Pt.

A plurality of structures of a conductive material, including a plurality of bit line structures, is arranged orthogonally over, and have surfaces conformal with, the plurality of stacks. The plurality of structures includes inter-stack semiconductor body elements 220 between the stacks and linking elements 230 over the stacks connecting the inter-stack semiconductor body elements 220. The inter-stack semiconductor body elements 220 in the plurality of structures are arranged as vertical channels for the memory elements. The linking elements 230 in this example comprise a semiconductor, such as polysilicon, having a relatively high doping concentration so that they have higher conductivity than the inter-stack semiconductor body elements 220, which are arranged to provide vertical channels for the memory cells in the stacks. Vertical channels (e.g. 220) can comprise semiconductor materials adapted to act as channels for the memory cells, such materials as Si, Ge, SiGE, GaAs, SiC, and Graphene.

The memory device includes a memory layer, such as charge storage structures, in interface regions at cross-points (e.g. 280) between side surfaces of the conductive strips in the plurality of intermediate planes (WLs) in the stacks and the inter-stack semiconductor body elements (e.g. 220) in the plurality of structures. In the illustrated example, memory elements are disposed in interface regions at the cross-points (e.g. 280) between side surfaces of the plurality of stacks and the plurality of structures. The memory elements are configured in vertical, dual-gate NAND strings, where the conductive strips on both sides of a single inter-stack semiconductor body element behave as dual-gates, and can be operated cooperatively for read, erase and program operations.

Charge storage structures in the memory device can include multilayer dielectric charge trapping structures known from flash memory technologies as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

A reference conductor 260 is disposed between the bottom plane (GSL) of conductive strips and the integrated circuit substrate (not shown). At least one reference line structure is arranged orthogonally over the plurality of stacks, including inter-stack vertical conductive elements 240 between the stacks in electrical communication with the reference conductor 260, and linking elements 250 over the stacks 210 connecting the inter-stack vertical conductive elements 240. The inter-stack vertical conductive elements 240 can have a higher conductivity than the inter-stack semiconductor body elements 220.

The memory device 200 includes string select switches 290 at interface regions with the top plane of conductive strips, and reference select switches 270 at interface regions with the bottom plane (GSL) of conductive strips. The dielectric layers of the charge storage structure can act as gate dielectric layers for the switches 270, 290 in some examples.

The memory device 200 includes a first overlying patterned conductive layer (not shown) connected to the plurality of bit line structures, including a plurality of global bit lines coupled to sensing circuits. The memory device also includes a second overlying conductive layer (not shown), which can be patterned, and can be above or below the first patterned conductor layer. The second overlying conductive layer is connected to the at least one reference line structure, such as by contact to the linking element 250. The second patterned conductor layer can connect the at least one reference line structure to a reference voltage source, or to circuitry for providing a reference voltage.

In the example shown in FIG. 2, the linking elements 230 of the bit line structures include N+ doped semiconductor material. The inter-stack semiconductor body elements 220 of the bit line structures include lightly doped semiconductor material. In the example shown in FIG. 2, the reference conductor 260 includes N+ doped semiconductor material, and the linking elements 250 of the at least one reference line structure include N+ doped semiconductor material. The inter-stack vertical conductive elements 240 of the at least one reference line structure also include N+ doped semiconductor material. In alternative implementations a metal or metal compound can be used in place of the doped semiconductors. In one embodiment, in order to reduce the resistance of the reference conductor 260, the memory device can include a bottom gate 201 near the reference conductor 260.

FIG. 2 includes an illustration of linking elements separated by insulating layers, and connected to respective conductive strips arranged as horizontal word lines and ground select lines (GSL), configured for staircase contacts to overlying decoding circuits. String selection lines in the top plane of conductive strips are independently coupled to and controlled by the string selection line decoding circuits. The insulating layers between the linking elements in the Z-direction can include the insulating material as described for the insulating strips in the vertical gate structure as described in connection with FIG. 1.

Conductive strips in the intermediate planes (WLs), and conductive strips in the bottom plane (GSL) are connected together to reduce decoder areas and consequently the overall size of the memory device. Conductive strips in the top plane (SSL) are individually decoded to allow correct bit line decoding.

A contact structure including linking elements, such as linking elements 261 and 262, provide pad areas connecting sets of word lines in the intermediate planes (WL). Interlayer connectors, such as interlayer connectors 271 and 272, are coupled to landing areas in the linking elements 261 and 262, where the linking elements include openings through which interlayer connectors coupled to landing areas in lower intermediate planes extend. The landing areas are at interface regions between bottom surfaces of the interlayer connectors and top surfaces of the linking elements.

In the example shown in FIG. 2, interlayer connectors for sets of word lines at multiple layers in the plurality of intermediate planes are arranged in a staircase structure. Accordingly, interlayer connectors 271 and 272 are connected to landing areas at two different layers in the plurality of intermediate planes. The staircase structure can be formed in a word line decoder region near the boundary of a region for the array of NAND strings of memory cells and a region for peripheral circuits.

In the example shown in FIG. 2, the memory device includes linking elements, such as a linking element 263, connecting sets of ground selection lines in the bottom plane (GSL) of conductive strips, and interlayer connectors, such as an interlayer connector 273, coupled to landing areas in the linking elements in the bottom plane, where the interlayer connectors extend through the openings in the linking elements in the intermediate planes (WLs). The landing areas are at interface regions between bottom surfaces of the interlayer connectors, such as an interlayer connector 273, and top surfaces of the linking elements, such as a linking element 263.

Figure 3:
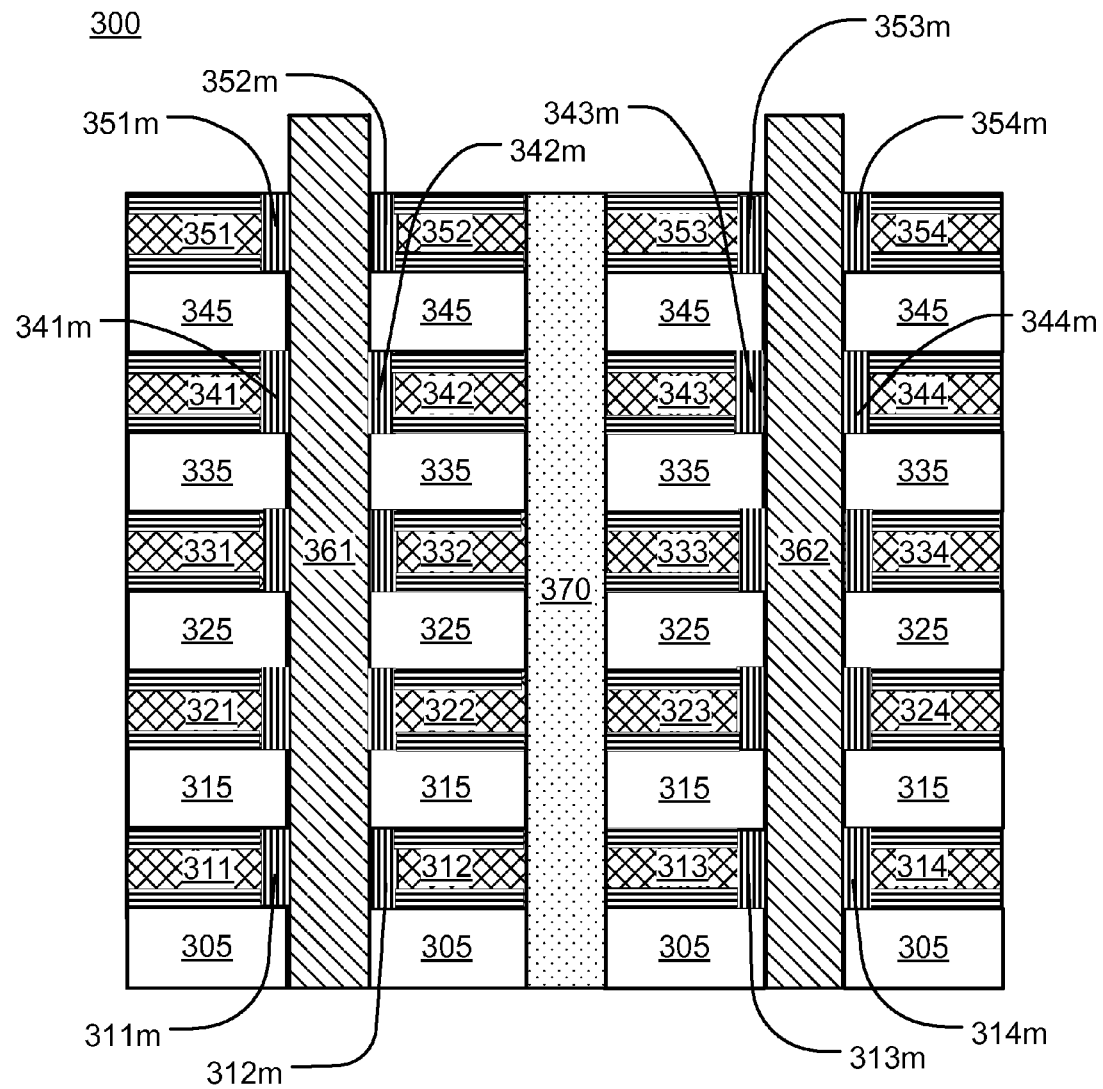
FIG. 3 is a perspective illustration of an implementation of a three-dimensional (3D) integrated circuit device using a different vertical channel structure.

FIG. 3 is a perspective illustration of an implementation of a three-dimensional (3D) integrated circuit device using a different vertical channel structure. A device 300 illustrated in FIG. 3 includes a plurality of stacks of conductive strips alternating with insulating strips in the Z-direction on an integrated circuit substrate. At least one of the insulating strips includes an insulating material with a dielectric constant lower than that of silicon dioxide, which is about 3.9. As a result, the equivalent oxide thickness EOT of an insulating strips is greater than its physical thickness. Insulating strips in the vertical channel structure as described in connection with FIG. 3 include the insulating material as described for the insulating strips in the vertical gate structure as described in connection with FIG. 1.

FIG. 3 is a cross-sectional diagram of the 3D memory device 300 shown in an X-Z plane. As illustrated in the example of FIG. 3, a memory device 300 includes an array of NAND strings of memory cells formed on an integrated circuit substrate. The device includes a plurality of stacks of conductive strips alternating with insulating strips (e.g. 305, 315, 325, 335, 345), including at least a bottom plane (GSL) of conductive strips (e.g. 311-314), a plurality of intermediate planes (WLs) of conductive strips (e.g. 321-324, 331-334, 341-344), and a top plane (SSLs) of conductive strips (e.g. 351-354). At least one of the insulating strips includes an insulating material with a dielectric constant lower than that of silicon dioxide, which is about 3.9. As a result, the equivalent oxide thickness EOT of an insulating strips is greater than its physical thickness. A plurality of structures of a conductive material, including a plurality of vertical conductive strips (e.g. 361, 362), is arranged orthogonally over the plurality of stacks. Memory elements, including a memory layer, such as charge storage structures (e.g. 341m, 342m, 343m, 344m), are disposed in interface regions at cross-points between side surfaces of the conductive strips in the plurality of intermediate planes in the plurality of stacks and the vertical conductive strips in the plurality of structures. Conductive strips in the stacks of conductive strips can be arranged as word lines, string select lines (SSL), and ground select lines (GSL) including gates for the memory elements, and structures in the plurality of structures can be arranged as vertical channels for the memory elements.

String select switches (SSL), including the memory layer, such as charge storage structures (e.g. 351m, 352m, 353m, 354m), are disposed in interface regions at cross-points between side surfaces of the conductive strips in the top plane (SSLs) of conductive strips (e.g. 351-354) in the plurality of stacks and the vertical conductive strips in the plurality of structures. Reference select switches (GSL), including a memory layer, such as charge storage structures (e.g. 311m, 312m, 313m, 314m), are disposed in interface regions at cross-points between side surfaces of the conductive strips in the bottom plane (GSL) of conductive strips (e.g. 311-314) in the plurality of stacks and the vertical conductive strips in the plurality of structures.

The conductive strips in the plurality of stacks of conductive strips are disposed in a Y-direction perpendicular to the X-Z plane, and are connected to decoding circuitry in the memory device. A reference conductor (not shown) can be disposed in a level between the bottom plane of conductive strips and the integrated circuit substrate, and connected to the plurality of vertical conductive strips. The reference conductor can include N+ doped semiconductor material. The memory device can include an overlying patterned conductor lines (not shown) connected to the plurality of vertical conductive strips, including a plurality of global bit lines coupled to sensing circuits. Insulation material 370 separates a stack of conductive strips (e.g. 312, 322, 332, 342, and 352) from an adjacent stack of conductive strips (e.g. 313, 323, 333, 343, and 353).

Figure 4:
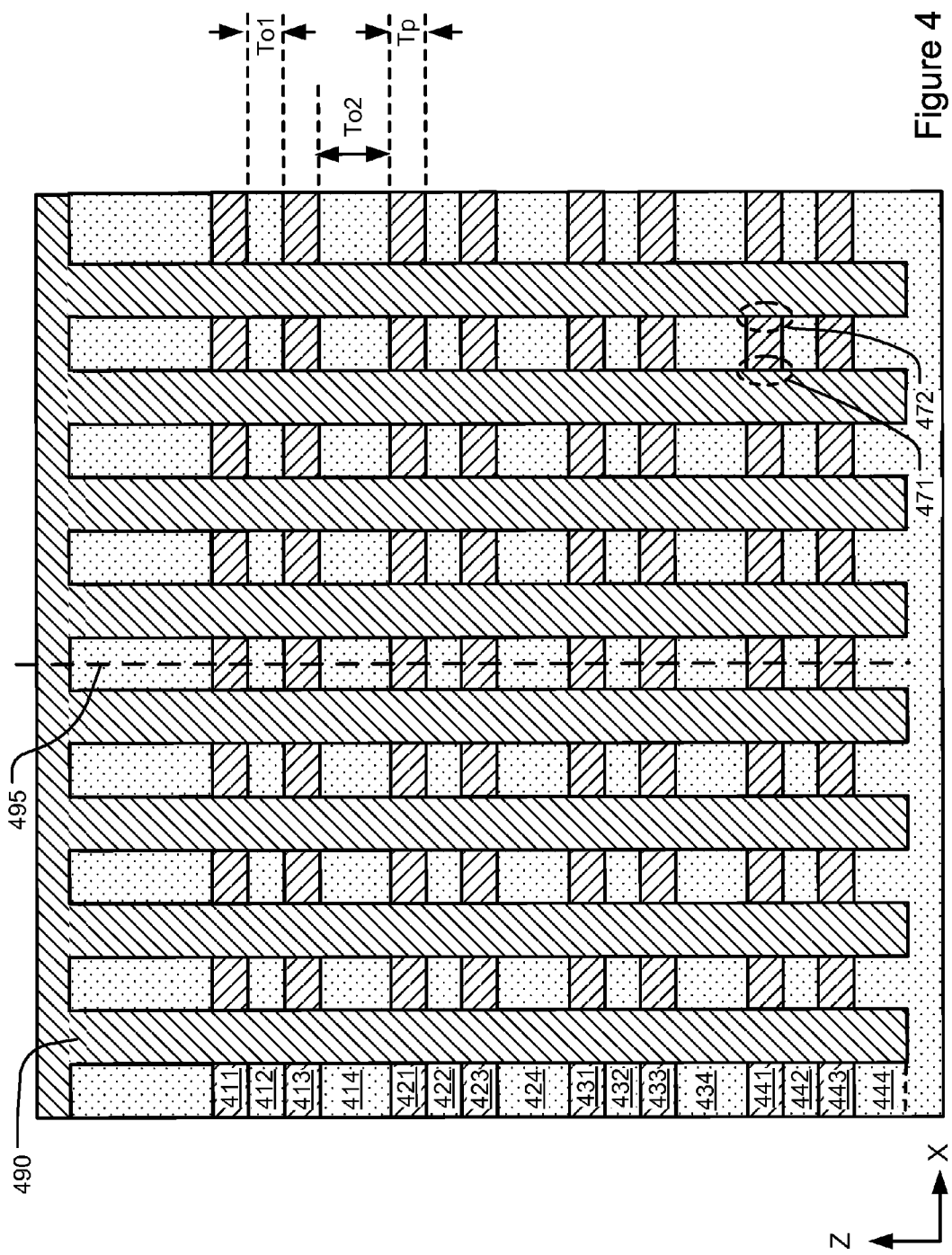
FIG. 4 illustrates a plurality of stacks of alternating conductive strips and insulating strips, where the insulating strips have non-simple spatial periods.

FIG. 4 illustrates a plurality of stacks of conductive strips (e.g. 411, 413, 421, 423, 431, 433, 441, 443) alternating with insulating strips (e.g. 412, 414, 422, 424, 432, 434, 442, 444) in a three-dimensional (3D) integrated circuit device, where the insulating strips have equivalent oxide thicknesses EOT so that the stacks have non-simple spatial periods on a line (e.g. 495) in a Z-direction through alternating conductive strips and insulating strips. At least one of the insulating strips includes an insulating material with a dielectric constant lower than that of silicon dioxide, which is about 3.9. As a result, the equivalent oxide thickness EOT of an insulating strips is greater than its physical thickness.

A plurality of structures of a conductive material (e.g. 490) is arranged orthogonally over, and having surfaces conformal with, the plurality of stacks, defining an multi-layer array of interface regions at cross-points between side surfaces of the conductive strips in the stacks and the structures in the plurality of structures (e.g. 471, 472). Memory elements (not shown) are disposed in the interface regions, which establish a 3D array of memory cells accessible via the plurality of stacks and the plurality of structures.

The stacks of conductive strips alternating with insulating strips in FIG. 4 can correspond to the stacks of conductive strips alternating with insulating strips in a cross section of the vertical gate memory device shown in FIG. 1 in the X-Z plane, taken along a word line (e.g. 125-N WL, FIG. 1). The stacks of conductive strips alternating with insulating strips in FIG. 4 can correspond to the stacks of conductive strips alternating with insulating strips in a cross section of the vertical channel memory device shown in FIG. 2 in the X-Z plane, taken along a BL channel (e.g. 220, FIG. 2). The stacks of conductive strips alternating with insulating strips in FIG. 4 can correspond to the stacks of conductive strips alternating with insulating strips in a cross section of the vertical channel memory device shown in FIG. 3 in the X-Z plane.

Insulating layers in the stack of linking elements as described for vertical gate and vertical channel structures can also have equivalent oxide thicknesses so that the stack of linking elements separated by the insulating layers has non-simple spatial periods through linking elements and insulating layers in the stack.

As shown in the example of FIG. 4, the insulating strips in the stacks include a first group of strips (e.g. 412, 422, 432, 442) having a first equivalent oxide thickness (e.g. To1), and a second group of strips (e.g. 414, 424, 434) having a second equivalent oxide thickness (e.g. To2) that is greater than the first equivalent oxide thickness. The insulating strips in the stacks alternate in thickness between the first equivalent oxide thickness (e.g. To1) and the second equivalent oxide thickness (e.g. To2) that is greater than the first equivalent oxide thickness. The second equivalent oxide thickness (e.g. To2) is greater than a thickness of the conductive strips (e.g. Tp).

As used in the present application, the term "non-simple spatial period" means that for the same etch process, at least one of (1) the conductive layers have different etch times, or (2) the insulating layers have different etch times, typically because the conductive and/or insulating layers are made of different materials with different etching characteristics, or different thicknesses, or a combination of different materials and different thicknesses for the conductive and/or insulating layers. A stack of alternating conductive strips and insulating strips can have a first group of insulating strips made of a first material and having a first equivalent oxide thickness, and a second group of insulating strips made of a second material and having a second equivalent oxide thickness. The first material and the second material can be the same or different. Given the first and second materials and the first and second equivalent oxide thicknesses, actual thicknesses of the first group of insulating strips and actual thicknesses of the second group of insulating strips can be designed to achieve different etch times or different electrical performances such that the first group of insulating strips and the second group of insulating strips have non-simple spatial periods.

Because the second equivalent oxide thickness (e.g. To2) is greater than the first equivalent oxide thickness (e.g. To1), interference between adjacent layers can be reduced, such that a conductive layer (e.g. 413) can be affected less by an adjacent conductive layer below (e.g. 421) than by another adjacent active layer above (e.g. 411). Likewise, a conductive layer (e.g. 431) can be affected less by an adjacent active layer above (e.g. 423) than by another adjacent active layer below (e.g. 433).

Figure 5:
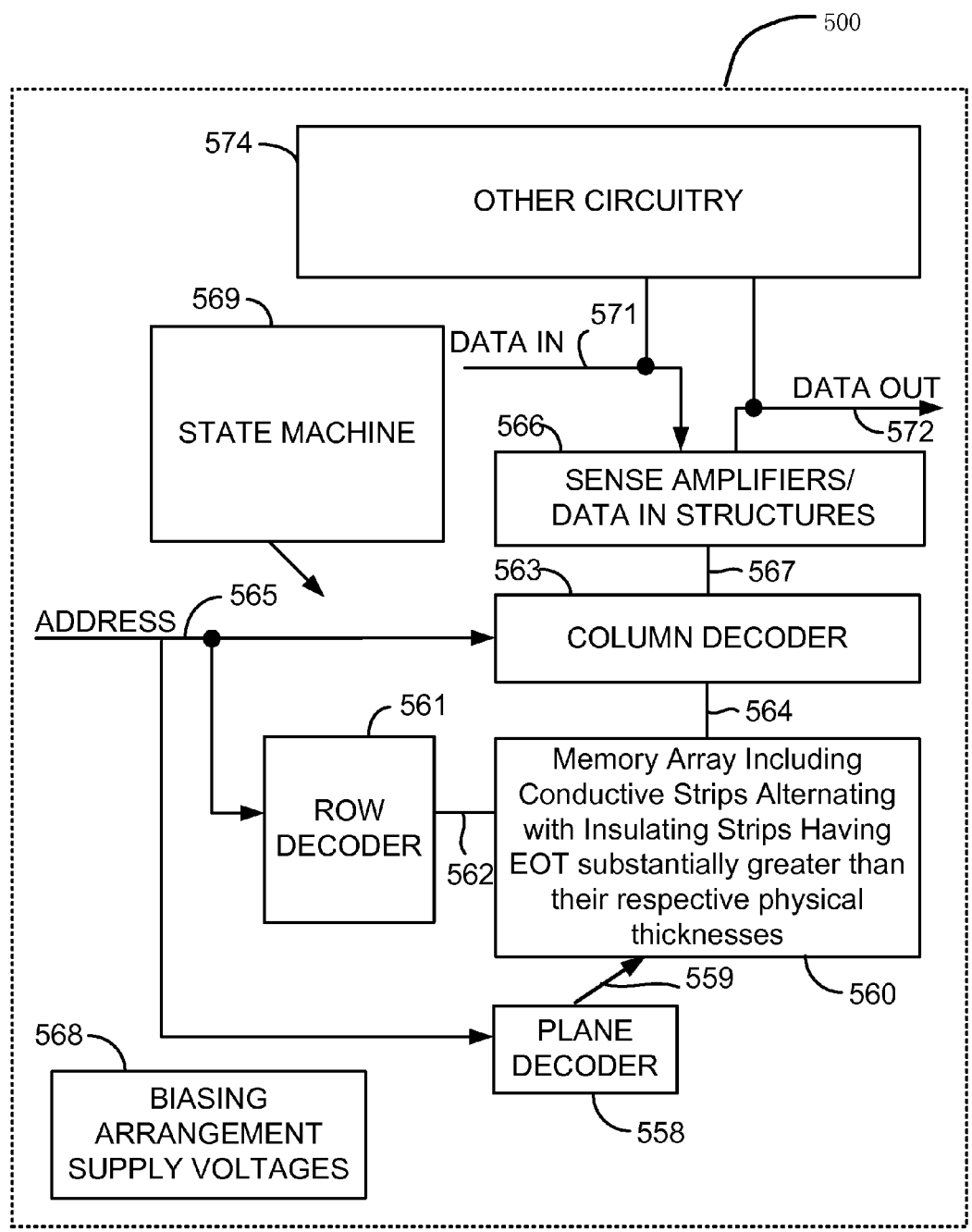
FIG. 5 is a simplified block diagram of an integrated circuit according to an implementation of the present invention.

FIG. 5 is a simplified block diagram of an integrated circuit according to an embodiment of the present invention. In the example shown in FIG. 5, the integrated circuit 500 includes a memory array 560, as described herein, on an integrated circuit substrate. The memory array 560 includes a plurality of stacks of conductive strips alternating with insulating strips, where at least one of the insulating strips has equivalent oxide thicknesses EOT substantially greater than their respective physical thicknesses. For insulating strips in the stack, the EOT is at least 10% greater than the respective physical thicknesses. A plurality of structures of a conductive material is arranged orthogonally over the plurality of stacks. Memory elements are disposed in interface regions at cross-points between side surfaces of the plurality of stacks and the plurality of structures.

A row decoder 561 is coupled to a plurality of word lines 562, and arranged along rows in the memory array 560. A column decoder 563 is coupled to a plurality of bit lines 564 (or SSL lines as described above) arranged along columns in the memory array 560 for reading and programming data from the memory cells in the memory array 560. A plane decoder 558 is coupled to a plurality of planes in the memory array 560 on SSL lines 559 (or bit lines as described above). Addresses are supplied on bus 565 to column decoder 563, row decoder 561 and plane decoder 558. Sense amplifiers and data-in structures in block 566 are coupled to the column decoder 563 in this example via data bus 567. Data is supplied via the data-in line 571 from input/output ports on the integrated circuit 500 or from other data sources internal or external to the integrated circuit 500, to the data-in structures in block 566. In the illustrated embodiment, other circuitry 574 is included on the integrated circuit, such as a general purpose processor or special purpose application circuitry, or a combination of modules providing system-on-a-chip functionality supported by the programmable resistance cell array. Data is supplied via the data-out line 572 from the sense amplifiers in block 566 to input/output ports on the integrated circuit 500, or to other data destinations internal or external to the integrated circuit 500.

A controller implemented in this example using bias arrangement state machine 569 controls the application of bias arrangement supply voltage generated or provided through the voltage supply or supplies in block 568, such as read and program voltages. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

Figure 6:
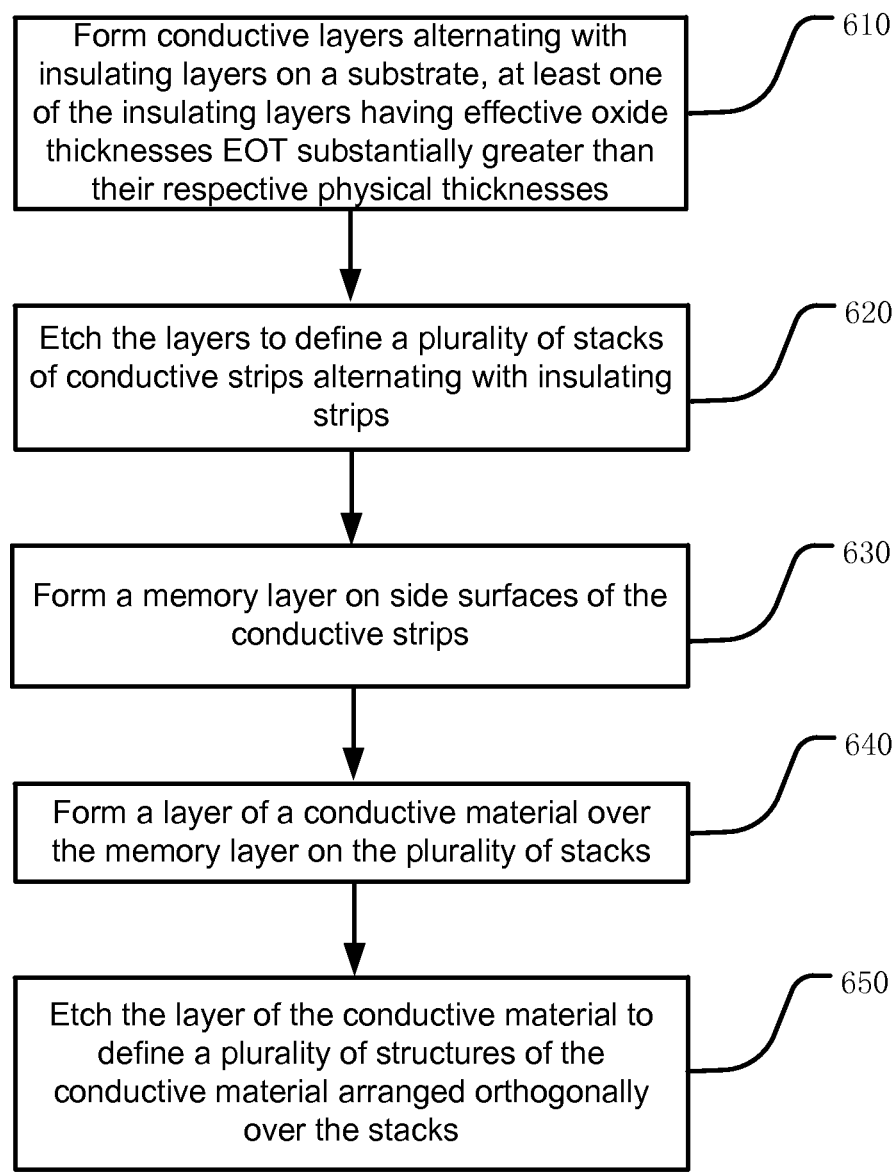
FIG. 6 is a simplified flowchart for manufacturing a three-dimensional (3D) memory device using conductive layers and insulating layers, where at least one of the insulating layers has equivalent oxide thicknesses EOT substantially greater than their respective physical thicknesses.

FIG. 6 is a simplified flowchart for manufacturing a three-dimensional (3D) memory device using conductive layers and insulating layers, where at least one of the insulating layers has equivalent oxide thicknesses EOT substantially greater than their respective physical thicknesses. A plurality of conductive layers alternating with insulating layers is formed on an integrated circuit substrate, where at least one of the insulating layers has equivalent oxide thicknesses EOT substantially greater than their respective physical thicknesses (Step 610). For insulating layers in the plurality of layers, the EOT is at least 10% greater than the respective physical thicknesses. The insulating layers can include an insulating material with a dielectric constant equal to or lower than 3.6. The plurality of layers can have non-simple spatial periods through the conductive layers and insulating layers in the plurality of layers.

The plurality of layers is etched to define a plurality of stacks of conductive strips alternating with insulating strips (Step 620). The stacks can have non-simple spatial periods through the conductive strips and insulating strips in the stacks. A memory layer is formed on side surfaces of the conductive strips in the plurality of stacks (Step 630). A layer of a conductive material is formed over the memory layer on the plurality of stacks (Step 640). The layer of the conductive material is etched to define a plurality of structures of the conductive material arranged orthogonally over the plurality of stacks (Step 650). As a result, memory elements are disposed in interface regions at cross-points between side surfaces of the plurality of stacks and the plurality of structures.

A stack of linking elements separated by insulating layers can be patterned at the same time that the plurality of stacks is defined, where the linking elements are connected to respective conductive strips in the stacks of conductive strips. A plurality of interlayer connectors can be formed in the stack of linking elements extending from a connector surface to respective linking elements. Patterned conductor lines can then be formed on top of the connector surface and connected to respective interlayer connectors.

For a vertical gate structure, the patterned conductor lines can include a plurality of global bit lines coupled to sensing circuits, where conductive strips in the stacks of conductive strips include channels for the memory elements, and structures in the plurality of structures are arranged as word lines and string select lines including vertical gates for the memory elements.

For a vertical channel structure, the patterned conductor lines can be coupled to decoding circuits, where conductive strips in the stacks of conductive strips are arranged as word lines and string select lines including gates for the memory elements, and structures in the plurality of structures are arranged as vertical channels for the memory elements.

Figure 7:
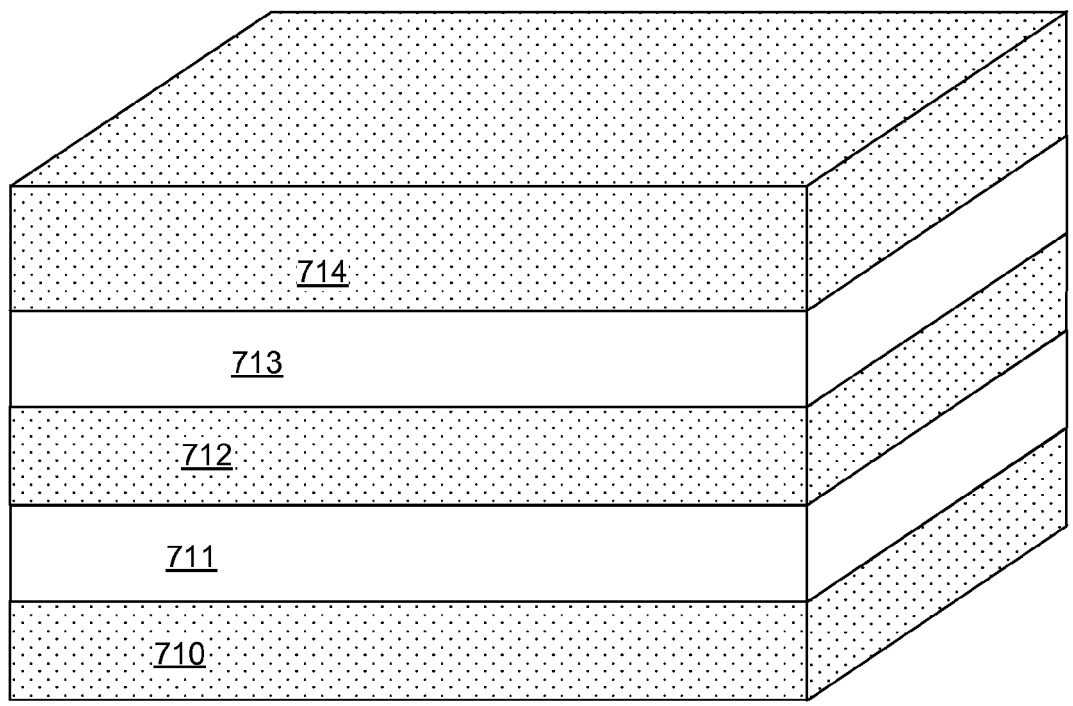
FIGS. 7 through 11 illustrate stages in a process for manufacturing a three-dimensional (3D) memory device in a vertical gate structure using conductive layers and insulating layers, where at least one of the insulating layers has equivalent oxide thicknesses EOT substantially greater than their respective physical thicknesses.

FIGS. 7 through 11 illustrate stages in a process for manufacturing a three-dimensional (3D) memory device in a vertical gate structure using conductive layers and insulating layers, where at least one of the insulating layers has equivalent oxide thicknesses EOT substantially greater than their respective physical thicknesses. An example of a vertical gate structures is as described for FIG. 1. In FIG. 7, a structure is shown which results from alternating deposition of insulating layers 710, 712, 714 and conductive layers 711, 713 formed using doped semiconductors for example in a blanket deposition in the array area of a chip. At least one of the insulating layers includes an insulating material with a dielectric constant lower than that of silicon dioxide, which is about 3.9. As a result, the equivalent oxide thickness EOT of at least one of the insulating layers is greater than its physical thickness. The insulating layers can include an insulating material with a dielectric constant equal to or lower than 3.6. Depending on the implementation, the conductive layers 711, 713 can be implemented using polysilicon or epitaxial single crystal silicon having n-type or p-type doping. Insulating layers 710, 712, 714 can be implemented for example using one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora. These layers can be formed in a variety of ways, including low pressure chemical vapor deposition LPCVD processes available in the art.

Figure 8:
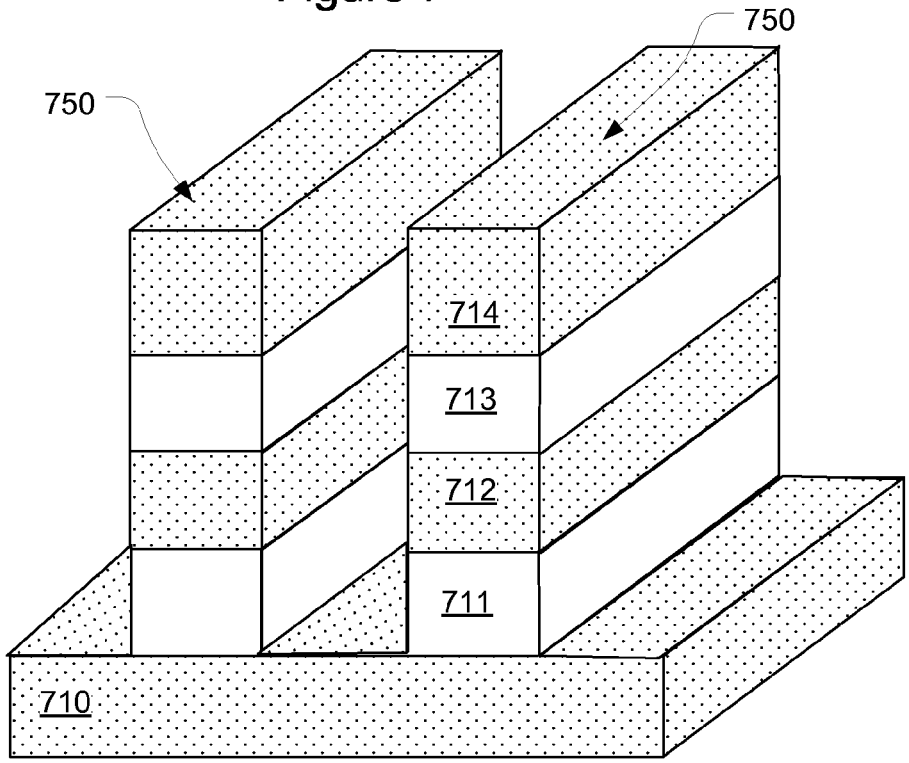

FIG. 8 shows the result of a first lithographic patterning step used to define a plurality of ridge-shaped stacks 750 of conductive strips, where the conductive strips are implemented using the material of the conductive layers 711, 713, and separated by the insulating layers 712, 714. Deep, high aspect ratio trenches can be formed in the stack, supporting many layers, using lithography based processes applying a carbon hard mask and reactive ion etching.

Figure 9:
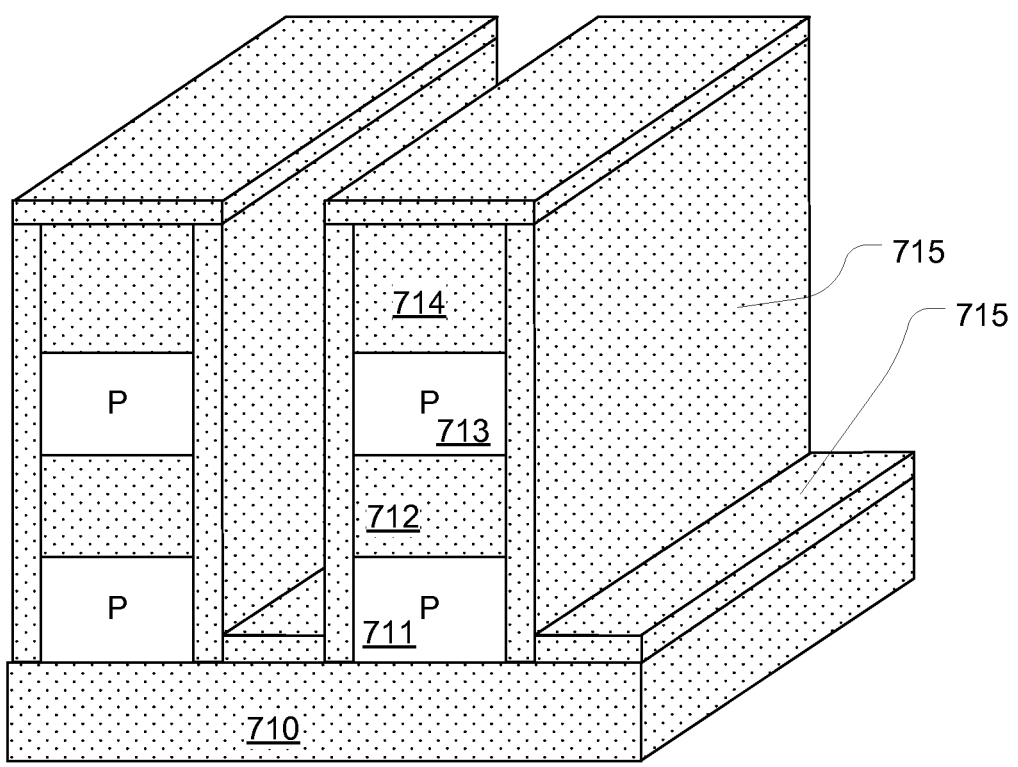

FIG. 9 shows results of a blanket deposition of a layer 715 of memory material in an implementation in which the memory material consists of a single layer. In an alternative, rather than a blanket deposition, an oxidation process can be applied to form oxides on the exposed sides of the conductive strips, where the oxides act as the memory material.

Figure 10:
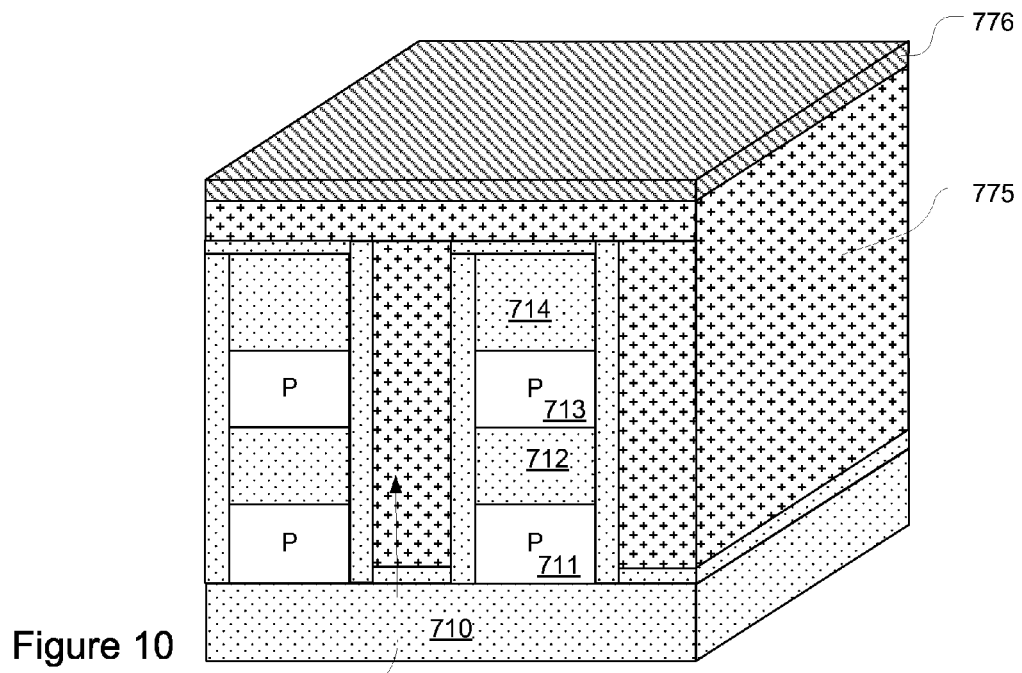

FIG. 10 shows the results of a high aspect ratio fill step in which conductive material, such as polysilicon having n-type or p-type doping, to be used for the conductive lines which act as word lines, is deposited to form layer 725. Also, a layer of silicide 726 can be formed over the layer 725 in implementations in which polysilicon is utilized. As illustrated in the figure, high aspect ratio deposition technologies such as low-pressure chemical vapor deposition of polysilicon in the illustrated implementations is utilized to completely fill the trenches 720 between the ridge-shaped stacks, even very narrow trenches on the order of 10 nanometers wide with high aspect ratio.

Figure 11:
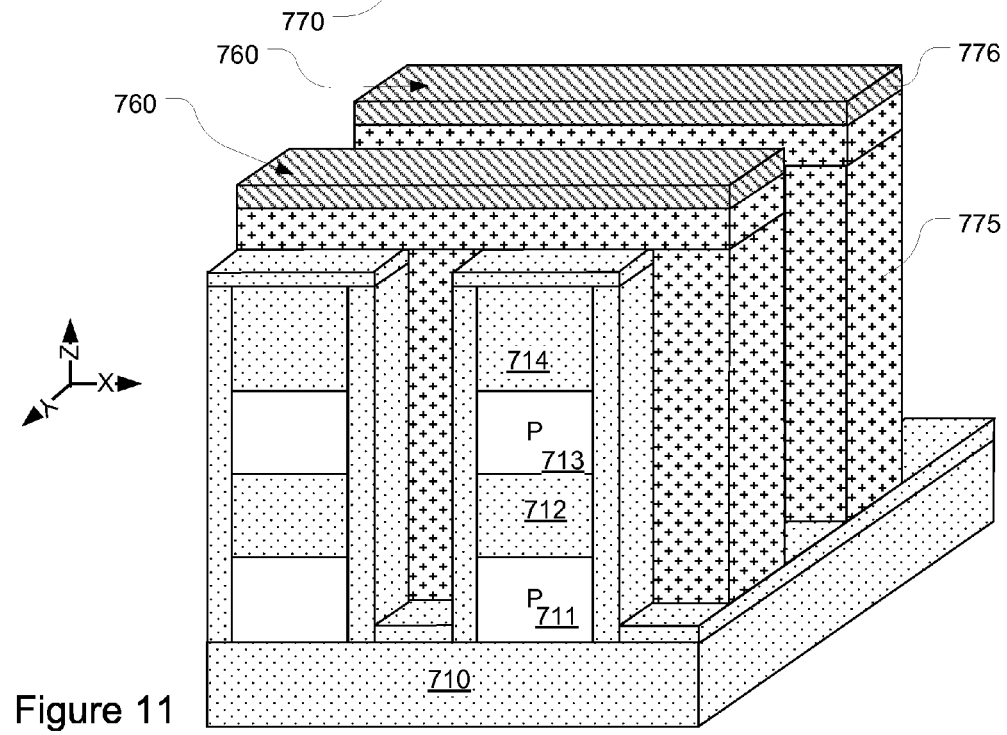

FIG. 11 shows results of the second lithographic patterning step used to define a plurality of conductive lines 760 which act as word lines for the 3D memory array. The second lithographic patterning step utilizes a single mask for critical dimensions of the array for etching high aspect ratio trenches between the conductive lines, without etching through the ridge-shaped stacks. Polysilicon can be etched using an etch process that is highly selective for polysilicon over silicon oxides or silicon nitrides. Thus, alternating etch processes are used, relying on the same mask to etch through the conductor and insulating layers, with the process stopping on the underlying insulating layer 710. The manufacturing process continues to complete a 3D memory array.

Figure 12:
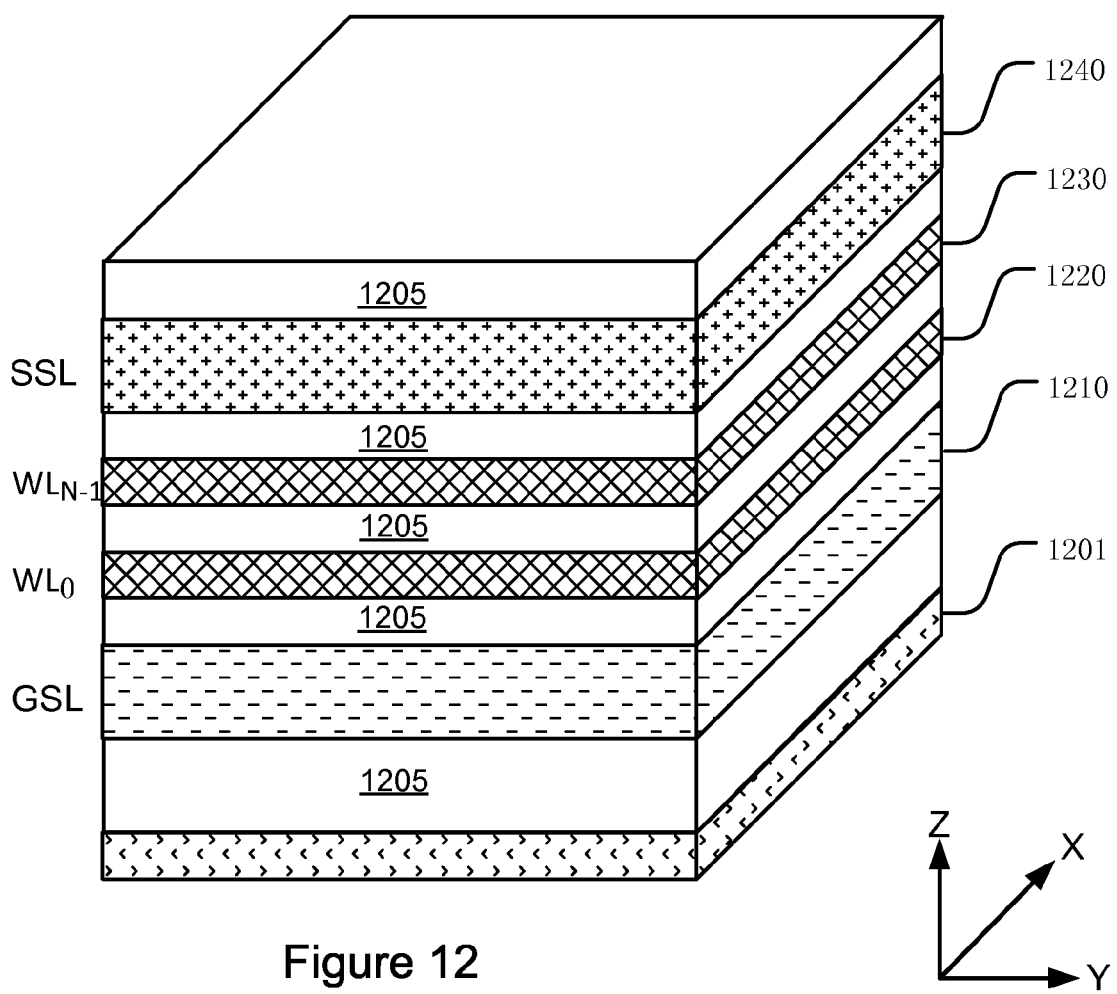
FIGS. 12 through 17 illustrate an example process flow for a vertical channel structure using conductive layers and insulating layers, where at least one of the insulating layers has equivalent oxide thicknesses EOT substantially greater than their respective physical thicknesses.

FIGS. 12 through 17 illustrate an example process flow for a vertical channel structure using conductive layers and insulating layers, where at least one of the insulating layers has equivalent oxide thicknesses EOT substantially greater than their respective physical thicknesses. FIG. 12 illustrates a stage of the process flow after forming an assist gate conductor 1201, and a plurality of conductive layers, such as layers 1210, 1220, 1230 and 1240, alternating with layers of insulating layers 1205, on an integrated circuit substrate (not shown). At least one of the insulating layers includes an insulating material with a dielectric constant lower than that of silicon dioxide, which is about 3.9. As a result, the equivalent oxide thickness EOT of at least one of the insulating layers is greater than its physical thickness. The insulating layers can include an insulating material with a dielectric constant equal to or lower than 3.6. The insulating material can be one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora.

Figure 13:
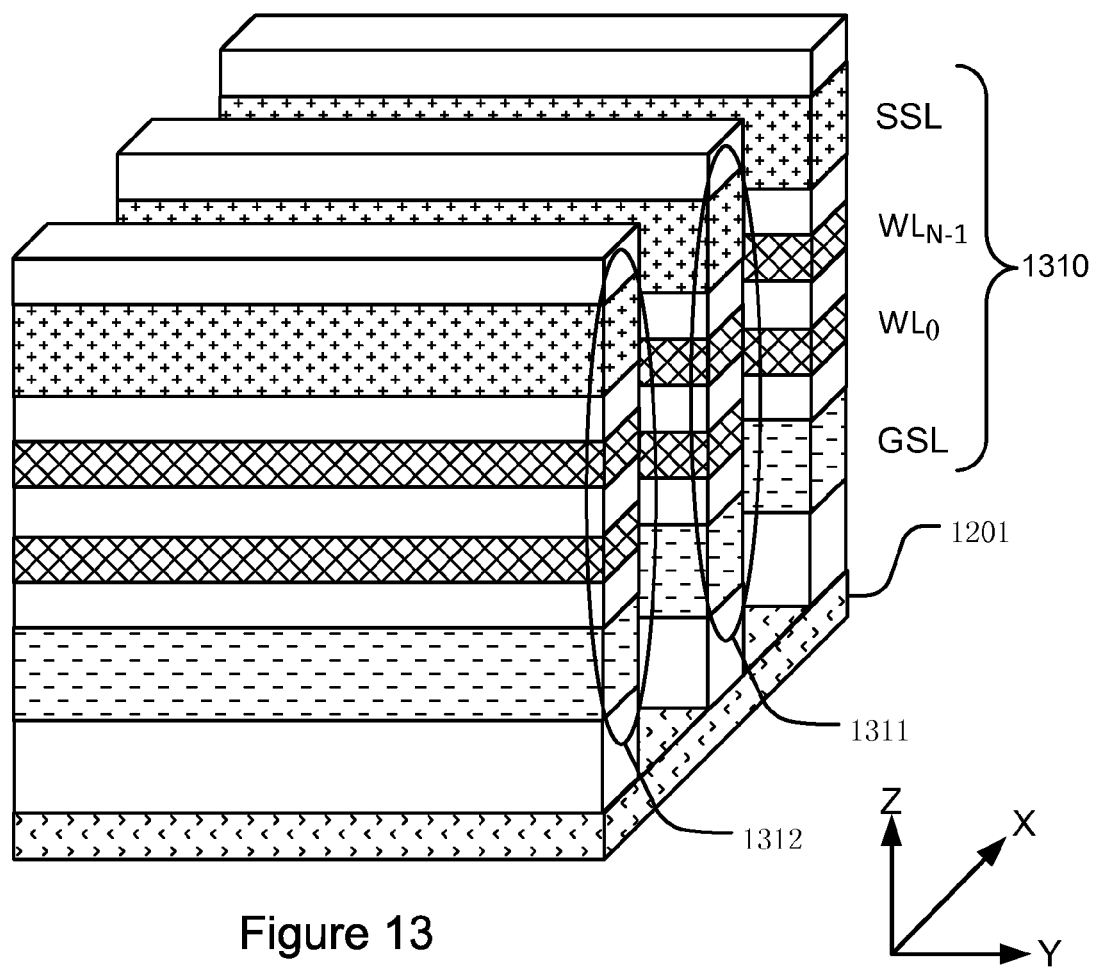

FIG. 13 illustrates a stage of the process flow after etching the plurality of layers, and stopping at the assist gate conductor 1201, to define a plurality of stacks of conductive strips, including stacks 1310, 1311 and 1312. The stacks 1310, 1311 and 1312 include at least a bottom plane (GSL) of conductive strips, a plurality of intermediate planes (WLs) of conductive strips, and a top plane of conductive strips (SSLs). The plurality of intermediate planes can include N planes, ranging from 0 to N−1, as illustrated in FIG. 13, for the stack 1310.

Figure 14:
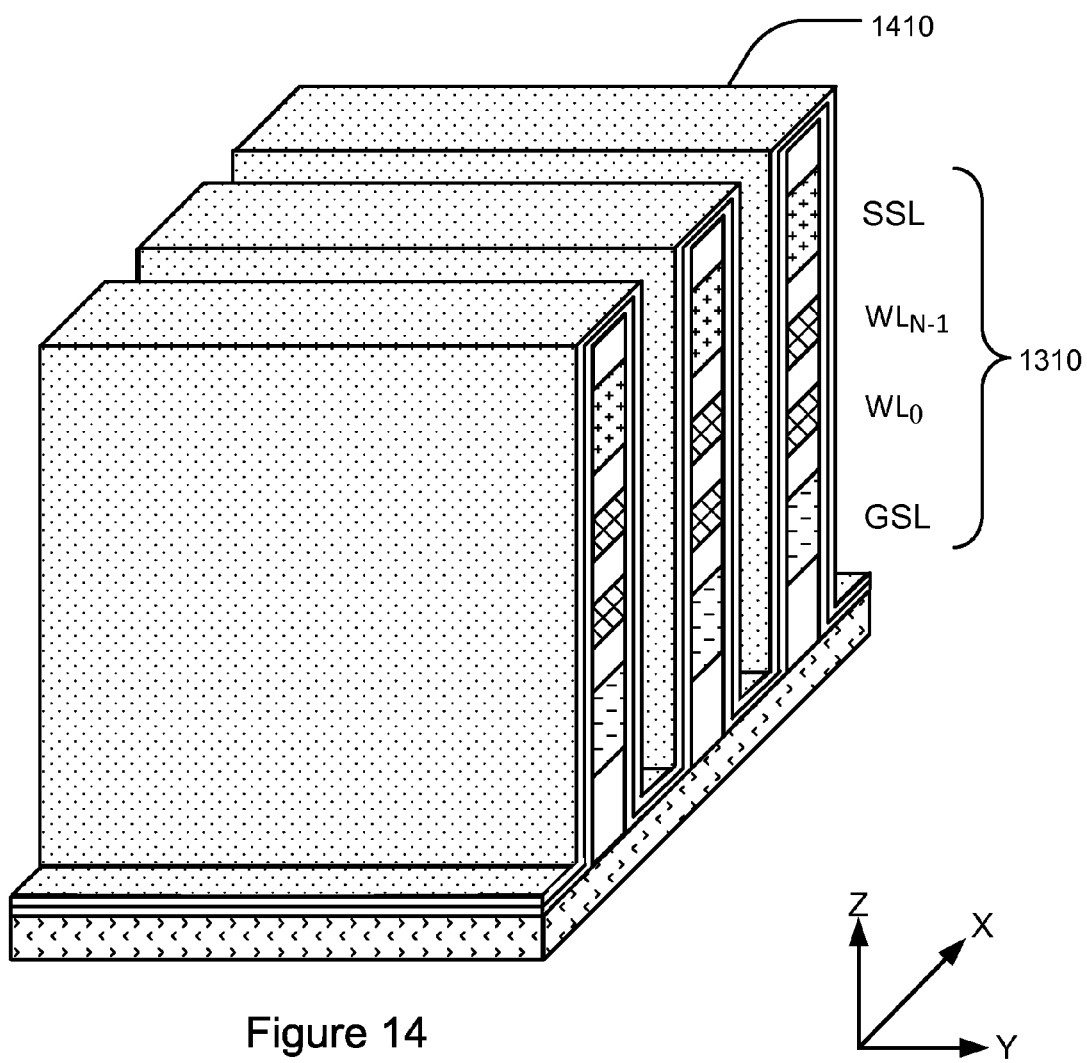

FIG. 14 illustrates a stage of the process flow after forming a memory layer 1410 over and on side surfaces of conductive strips in the plurality of stacks, including the stack 1310. The memory layer 1410 contacts side surfaces of the plurality of conductive strips. The memory layer 1410 can comprise a multilayer, dielectric charge storage structure.

Figure 15:
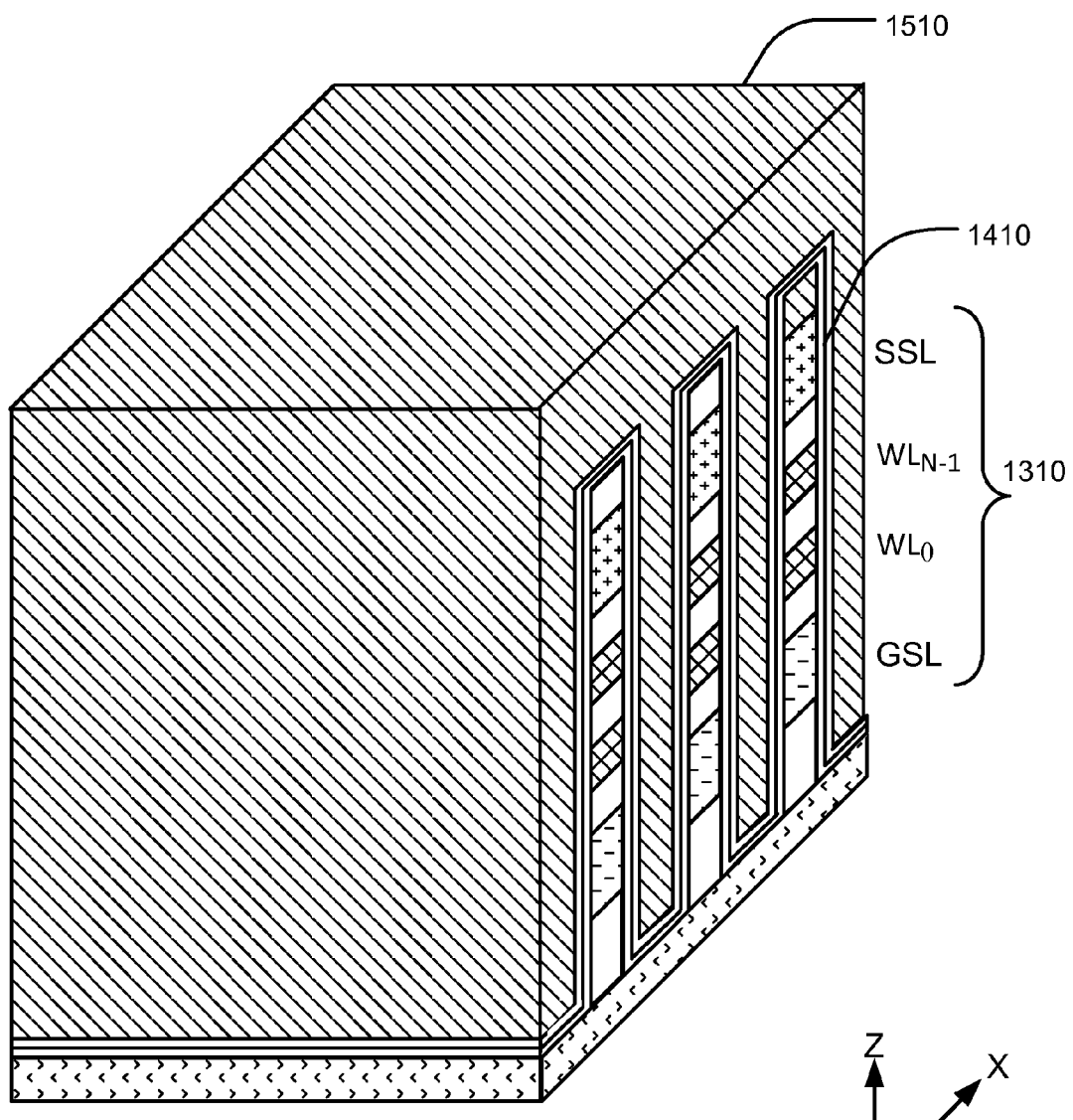

FIG. 15 illustrates a stage of the process flow after forming a layer of a second conductive material 1510 over, and having a surface conformal with, the memory layer 1410 on the plurality of stacks, including the stack 1310. The second conductive material comprises a semiconductor adapted at least in the regions between the stacks, to act as channel regions for vertical strings of memory cells.

Figure 16:
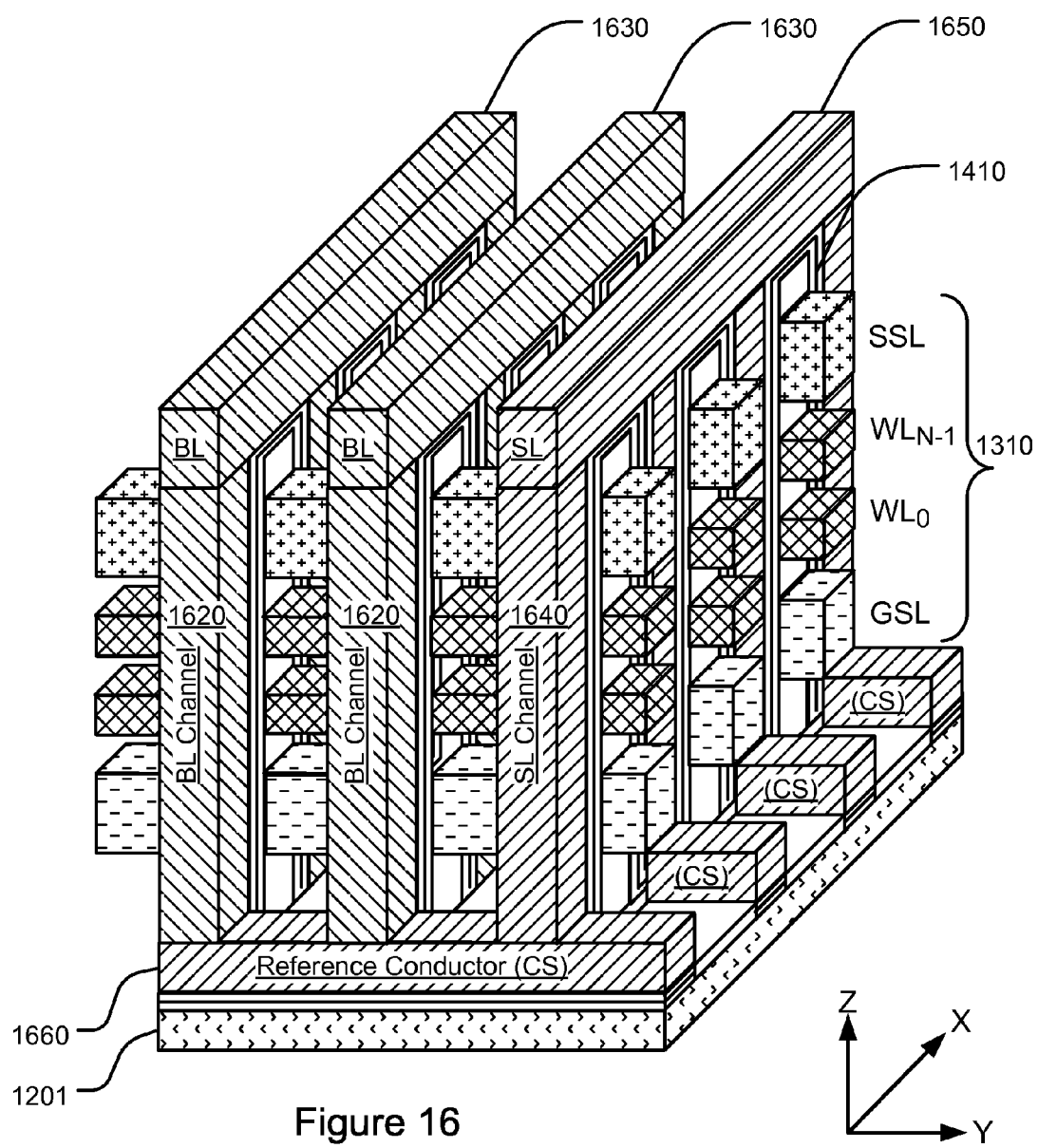

FIG. 16 illustrates a stage of the process flow after a patterned and timed etch of the layer of second conductive material 1510, which is timed to stop before reaching the memory layer 1410 between the stacks, so that a reference conductor (e.g. 1660) is formed between each stack. Other processes to stop the etching in order to form the reference conductor can be used as well, including the use of an etch stop layer, disposed in the second conductor material in the trenches at the desired depth. The pattern of the etch defines a plurality of bit line structures 1620/1630 arranged orthogonally over, and having surfaces conformal with, the plurality of stacks, including the stack 1310. The bit line structures 1620/1630 include inter-stack semiconductor body elements 1620 between the stacks extending to the reference conductors (e.g. 1660), and linking elements 1630 over the stacks connecting the semiconductor body elements 1620. To reveal underlying structure, the illustration shows openings between the stacks of conductive strips, in the regions between the bit line structures. However, these openings will be filled with an insulating material.

The step of etching the layer of second conductive material also defines at least one reference line structure 1640/1650, arranged orthogonally over the plurality of stacks. The reference line structure includes inter-stack vertical conductive elements 1640 extending to the reference conductor (e.g., 1660) between the stacks and linking elements 1650 over the stacks connecting the inter-stack vertical conductive elements 1640.

FIG. 16 illustrates that the reference conductor 1660 left as a result of the patterned, timed etch is disposed between the bottom plane (GSL) of conductive strips and the assist gate structure 1201 on the substrate.

Figure 17:
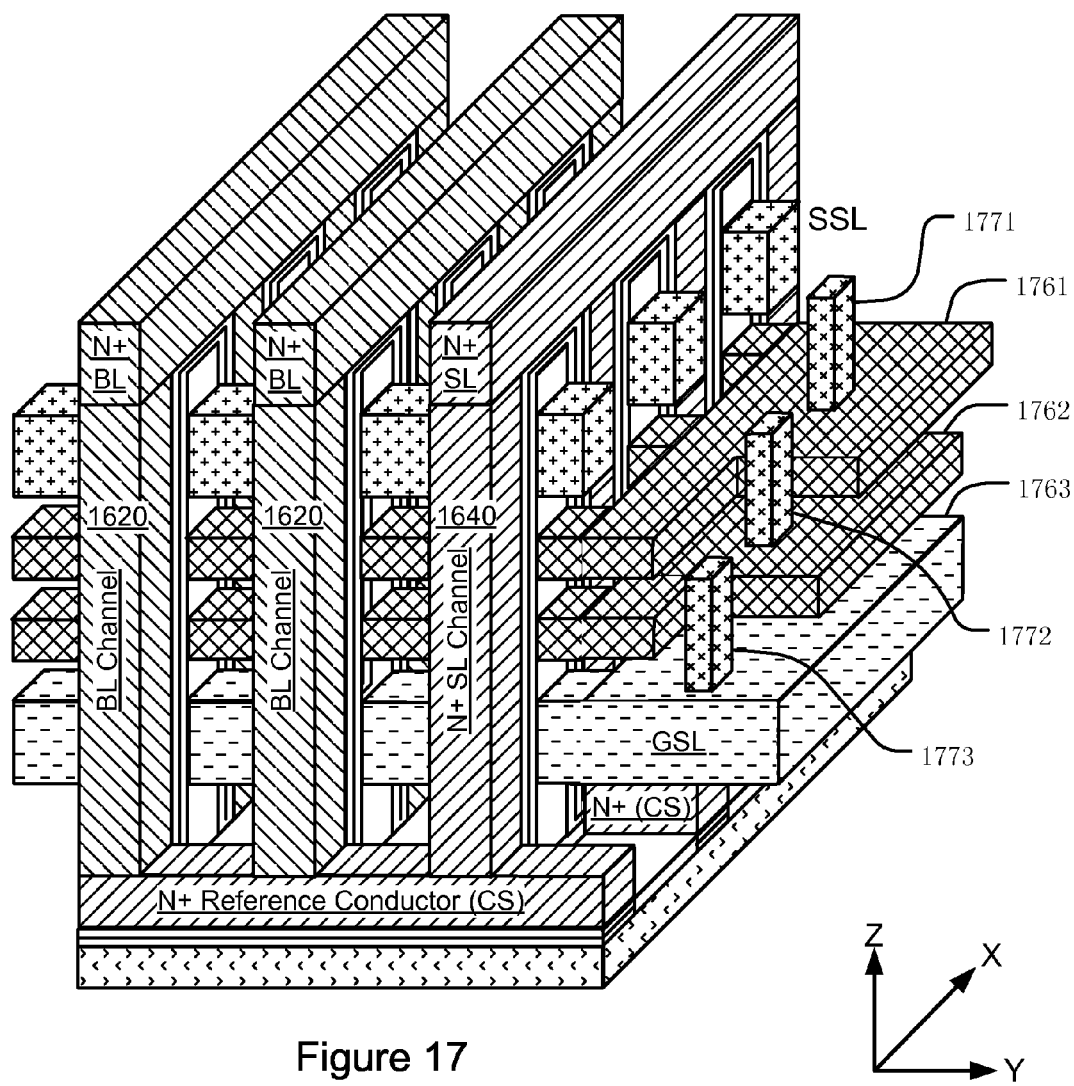

FIG. 17 illustrates a stage of the process flow following a staircase etching process used to isolate the individual SSL lines, and to form linking elements 1761, 1762, and 1763 coupled to the conductive strips in the plurality of stacks that include landing areas for interlayer connectors 1771, 1772, and 1773. The linking elements 1761, 1762, and 1763 can be patterned at the same time that the stacks are patterned. At least one of the insulating layers between the linking elements (e.g. 1205, FIG. 12) includes an insulating material with a dielectric constant lower than lower than that of silicon dioxide, which is about 3.9. The insulating layers can include an insulating material with a dielectric constant equal to or lower than 3.6. The manufacturing process continues to complete a 3D memory array.

Figure 18:
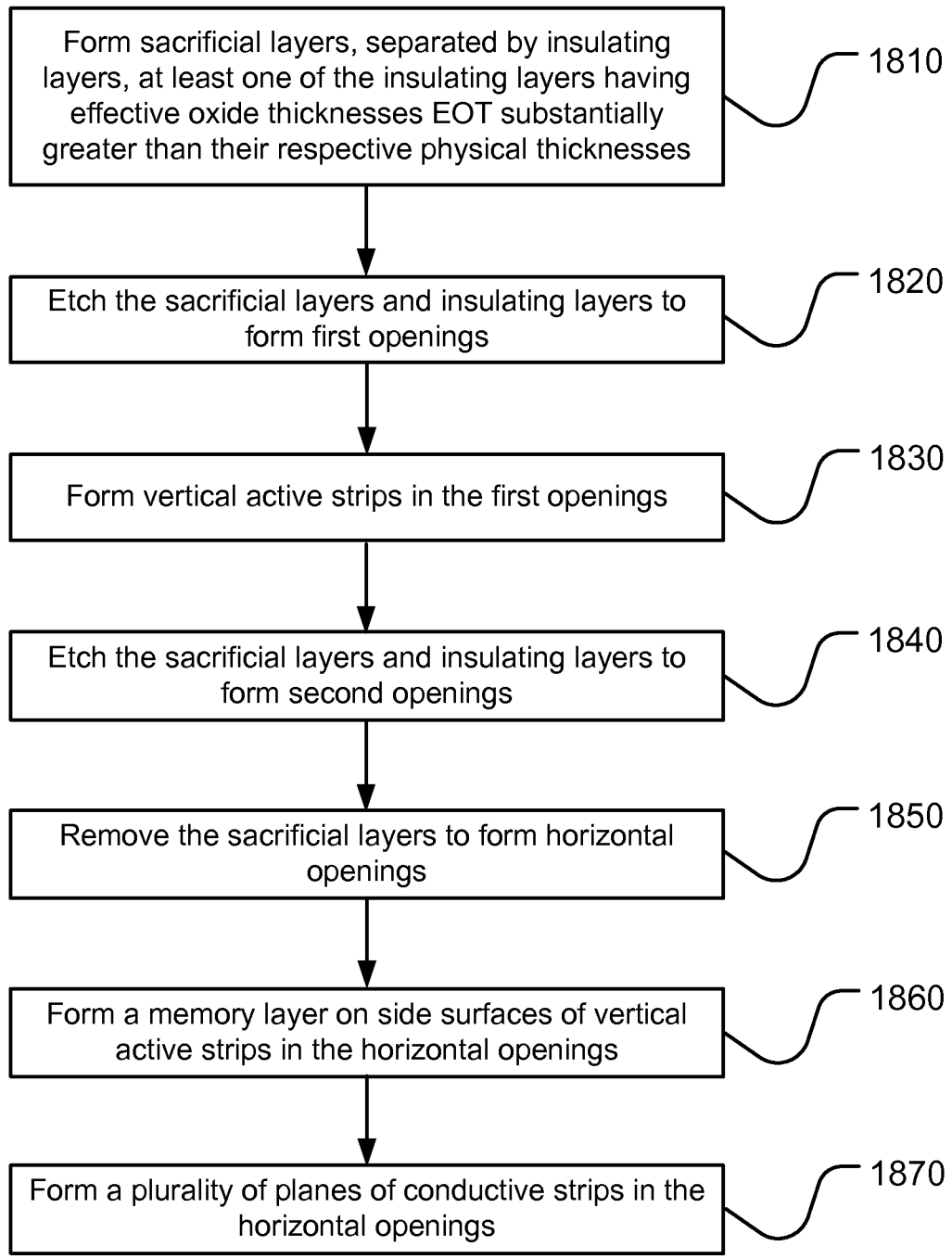
FIG. 18 is a simplified flowchart for manufacturing a vertical channel structure using sacrificial layers and insulating layers, where at least one of the insulating layers has equivalent oxide thicknesses EOT substantially greater than their respective physical thicknesses.

FIG. 18 is a simplified flowchart for manufacturing a vertical channel structure using sacrificial layers and insulating material layers, where at least one of the insulating layers has equivalent oxide thicknesses EOT substantially greater than their respective physical thicknesses. The method begins with forming a plurality of sacrificial layers alternating with insulating layers in the Z-direction on an integrated circuit substrate, where at least one of the insulating layers has equivalent oxide thicknesses EOT substantially greater than their respective physical thicknesses (Step 1810). The insulating layers can include an insulating material with a dielectric constant equal to or lower than 3.6, such as the dielectric constant of SiOF (fluorinated silicate glass). The insulating material is one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora.

The sacrificial and insulating layers are etched to form first openings (Step 1820). A plurality of vertical conductive strips are formed in the first openings (Step 1830). The sacrificial and insulating layers are then etched to form second openings between adjacent vertical conductive strips in the plurality of vertical conductive strips, thereby exposing the plurality of sacrificial layers (Step 1840). The plurality of sacrificial layers exposed by the second openings are removed to form horizontal openings between the insulating layers (Step 1850). A memory layer is formed on side surfaces of the vertical conductive strips in the horizontal openings (Step 1860). A plurality of planes of conductive strips is formed in the horizontal openings. Side surfaces of conductive strips in the plurality of planes contact the memory layer (Step 1870). The plurality of planes includes a plurality of intermediate planes (WLs) of conductive strips. The plurality of planes can include one of a top plane of conductive strips (SSL) that contacts the memory layer, and a bottom plane of conductive strips (GSL) that contacts the memory layer. Insulating material is then formed in the second openings.

The memory layer can include a multilayer dielectric charge storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal high-k bandgap engineered silicon-oxide-nitride-oxide-silicon).

The method can further include forming a reference conductor in a level between the plurality of sacrificial and insulating layers and the integrated circuit substrate, where the reference conductor is connected to the plurality of vertical conductive strips. The reference conductor can include N+ doped semiconductor material.

Figure 19:
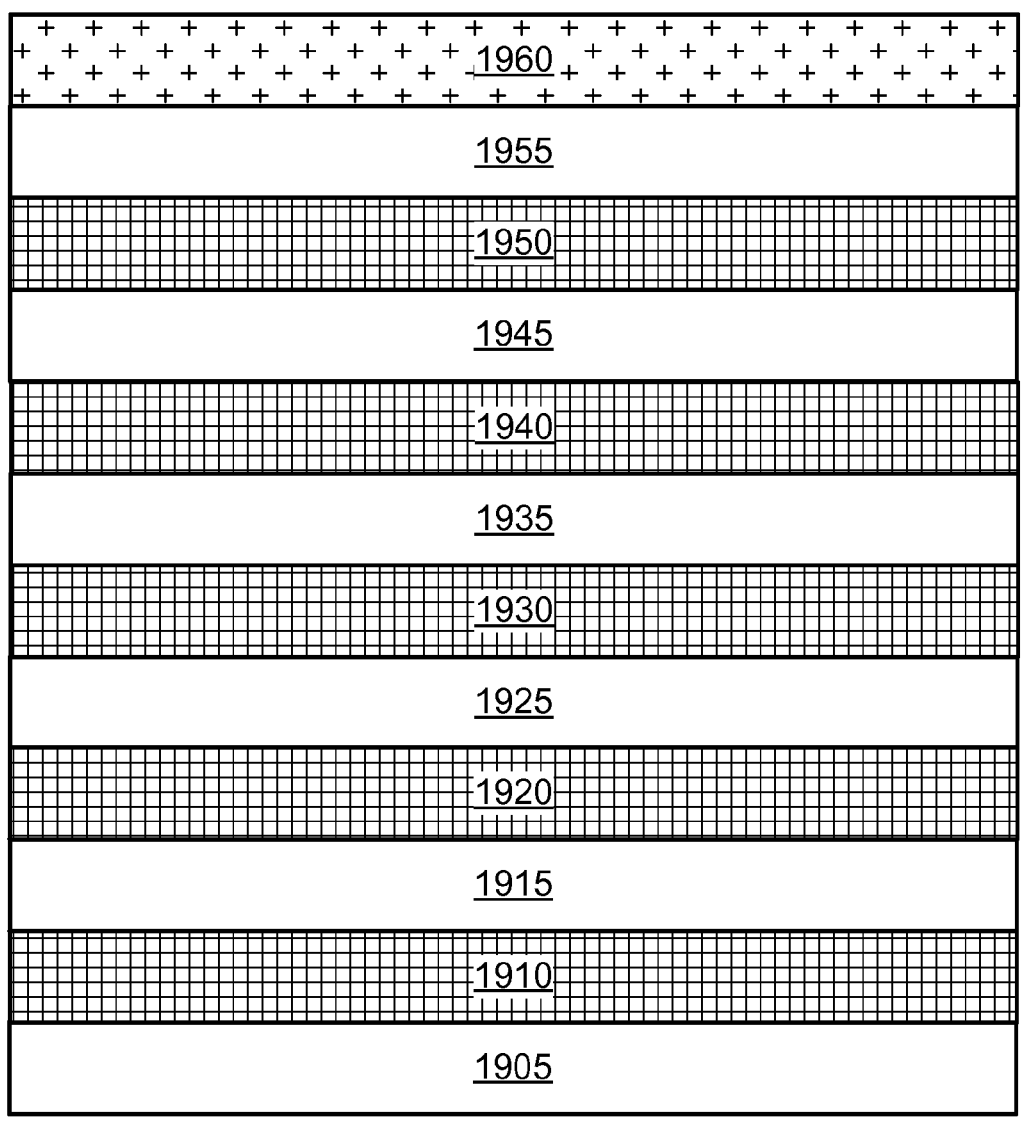
FIGS. 19 through 25 illustrate an example process flow for a vertical channel structure using sacrificial layers and insulating layers, where at least one of the insulating layers has equivalent oxide thicknesses EOT substantially greater than their respective physical thicknesses.
Figure 19:
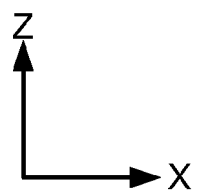

FIGS. 19 through 25 illustrate an example process flow for a vertical channel structure using sacrificial layers and insulating layers, where at least one of the insulating layers has equivalent oxide thicknesses EOT substantially greater than their respective physical thicknesses. FIG. 19 illustrates a cross-section in the X-Z plane of a partially fabricated memory device. In the example shown in FIG. 19, the memory device includes a plurality of sacrificial layers (e.g. 1920, 1930 and 1940) for forming word lines (WLs) on an integrated circuit substrate. The plurality of sacrificial layers can include a top sacrificial layer (e.g. 1950) for forming string select lines (SSL), and a bottom sacrificial layer (e.g. 1910) for forming ground select lines (GSL). The sacrificial layers are separated by insulating layers (e.g. 1905, 1915, 1925, 1935, 1945, and 1955). The plurality of sacrificial layers can include silicon nitride. At least one of the insulating layers includes an insulating material with a dielectric constant lower than lower than that of silicon dioxide, which is about 3.9. As a result, the equivalent oxide thickness EOT of at least one of the insulating layers is greater than its physical thickness. The insulating layers can include an insulating material with a dielectric constant equal to or lower than 3.6. The insulating material can be one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora.

A hard mask (e.g. 1960) is disposed on the sacrificial and conductive layers for patterning the sacrificial and insulating layers. The hard mask can include poly silicon, which is highly selective to the silicon nitride material used in the sacrificial layers, and to the insulating material used in the insulation layers.

Figure 20:
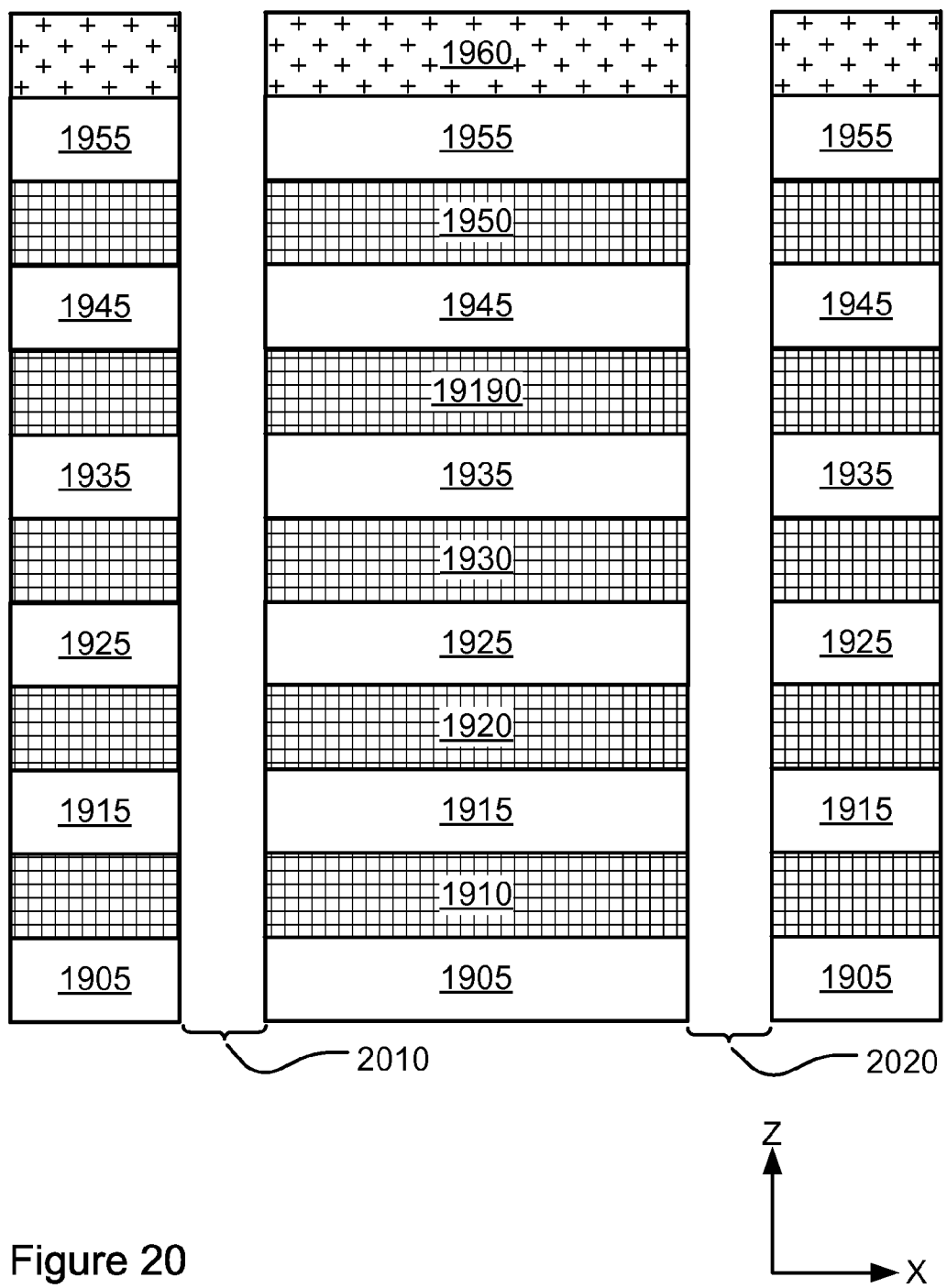

FIG. 20 illustrates a stage in the process after etching the sacrificial and insulating layers using the hard mask to form first openings (e.g. 2010, 2020). For instance, the sacrificial and insulating layers can be etched with RIE (reactive ion etching). The first openings are etched through the plurality of sacrificial layers (e.g. 1910, 1920, 1930, 1940, and 1950). The first openings are used to form a plurality of vertical active strips.

Figure 21:
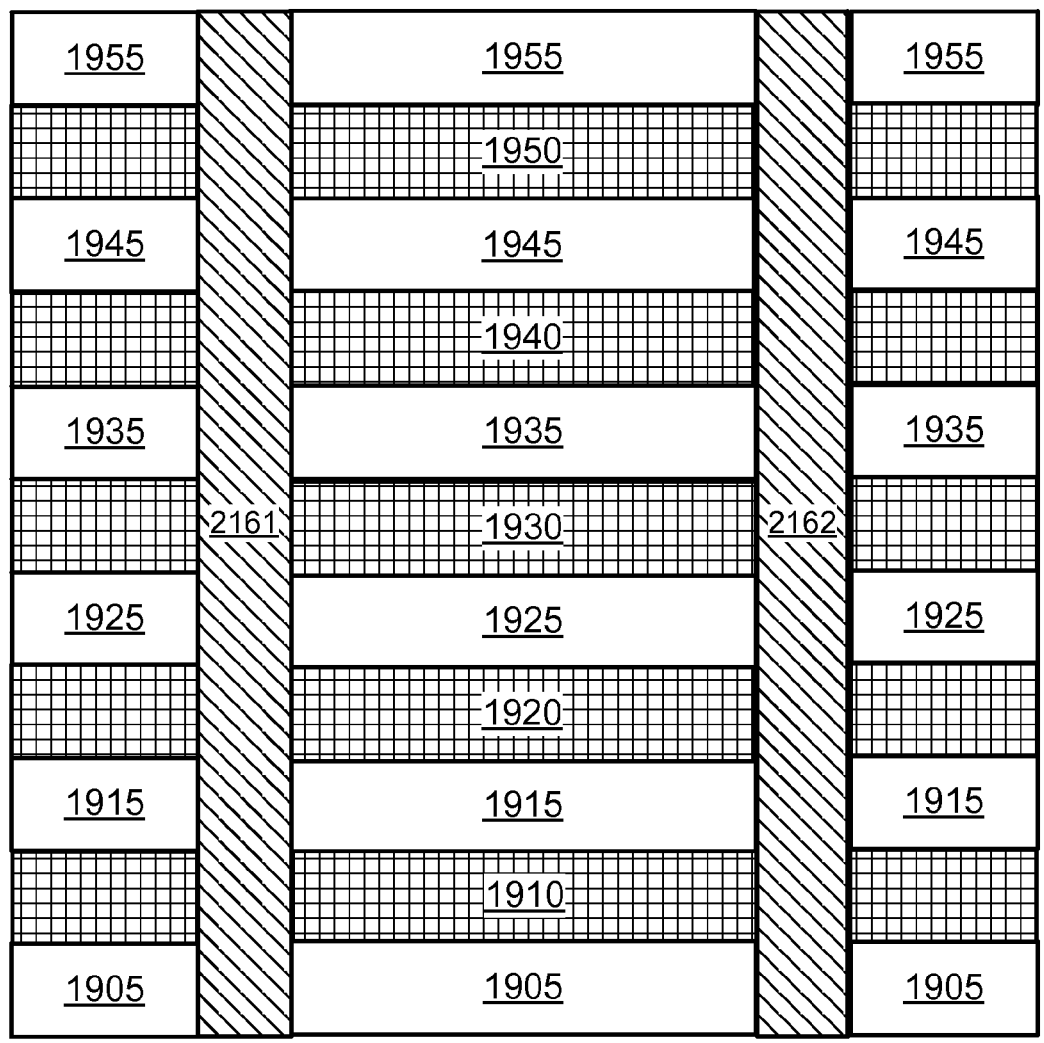

FIG. 21 illustrates a stage in the process after forming a plurality of vertical active strips (e.g. 2161, 2162) in the first openings. The plurality of vertical active strips can extend to a reference conductor layer (not shown) below the sacrificial and insulating layers. The hard mask (e.g. 1960) is planarized, for instance using CMP (chemical-mechanical-planarization), stopping at an insulation layer (e.g. 1955) below the hard mask.

Figure 22:
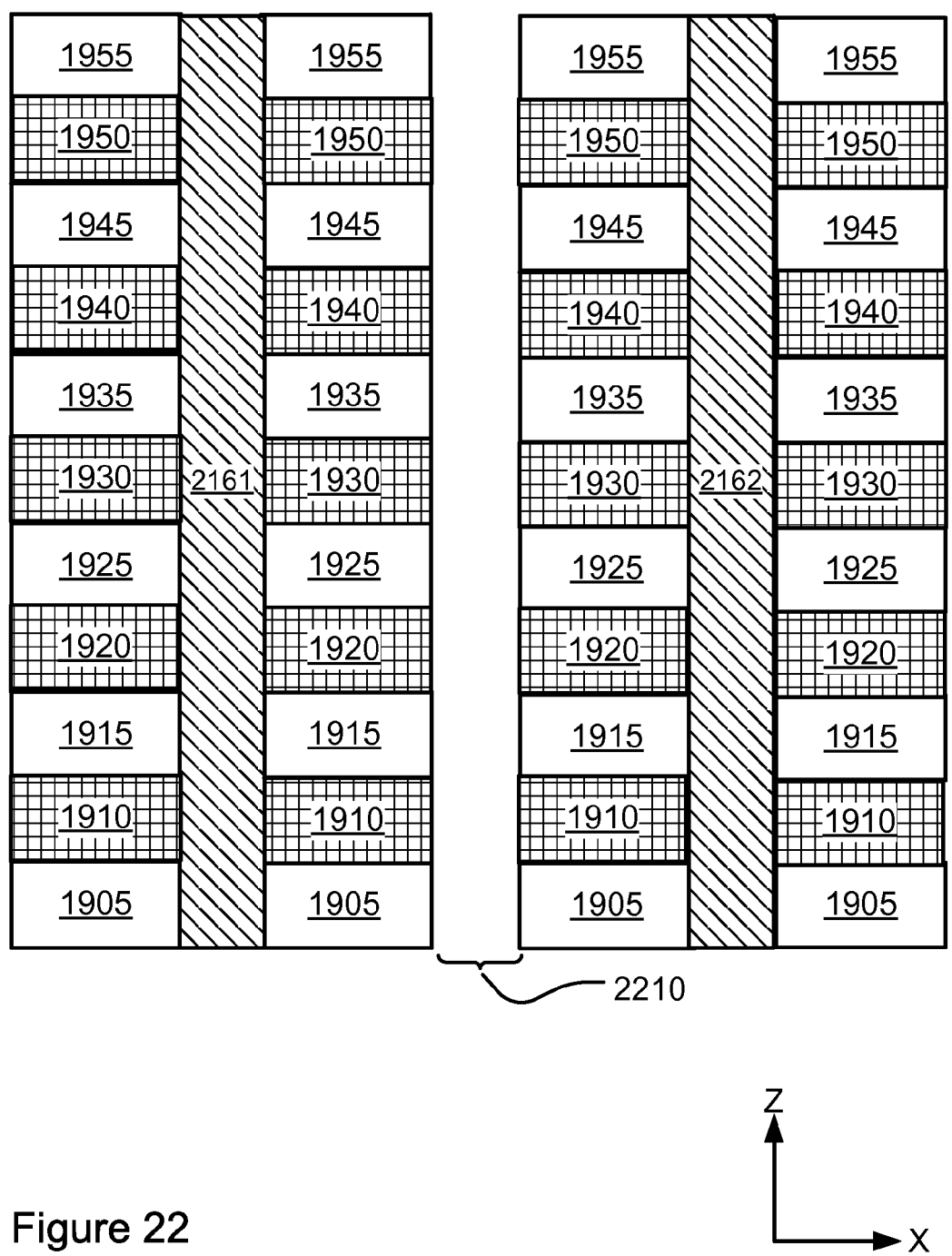

FIG. 22 illustrates a stage in the process after etching the sacrificial and insulating layers to form second openings (e.g. 2210) between adjacent vertical active strips (e.g. 2161, 2162) in the plurality of vertical active strips. The plurality of sacrificial layers (e.g. 1910, 1920, 1930, 1940 and 1950) is exposed by the second openings.

Figure 23:
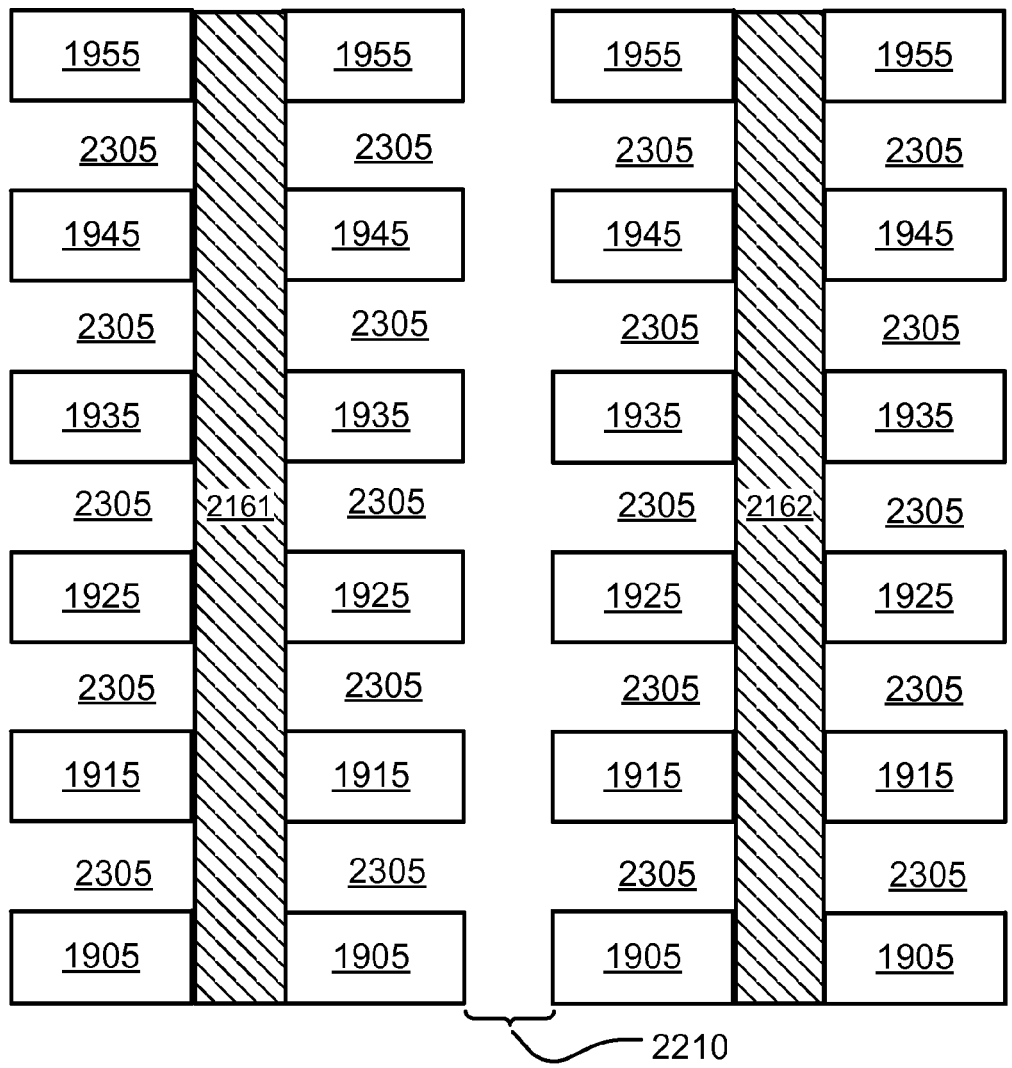

FIG. 23 illustrates a stage in the process after removing the plurality of sacrificial layers exposed by the second openings to form horizontal openings (e.g. 2305) between the insulating layers (e.g. 1905, 1915, 1925, 1935, 1945 and 1955). This stage in the process leaves the insulating layers adhered to the vertical active strips (e.g. 2161, 2162), with horizontal openings (e.g. 2305) in between. Horizontal openings 2305 can be used for forming word lines (WLs), string select lines (SSLs), and a ground select line (GSL). The plurality of sacrificial layers can be removed by an etching process using phosphoric acid (H3PO4) as an etchant. Phosphoric acid (H3PO4) is highly selective to the silicon nitride material used in the sacrificial layers, and to the insulating material used in the insulation layers.

Figure 24:
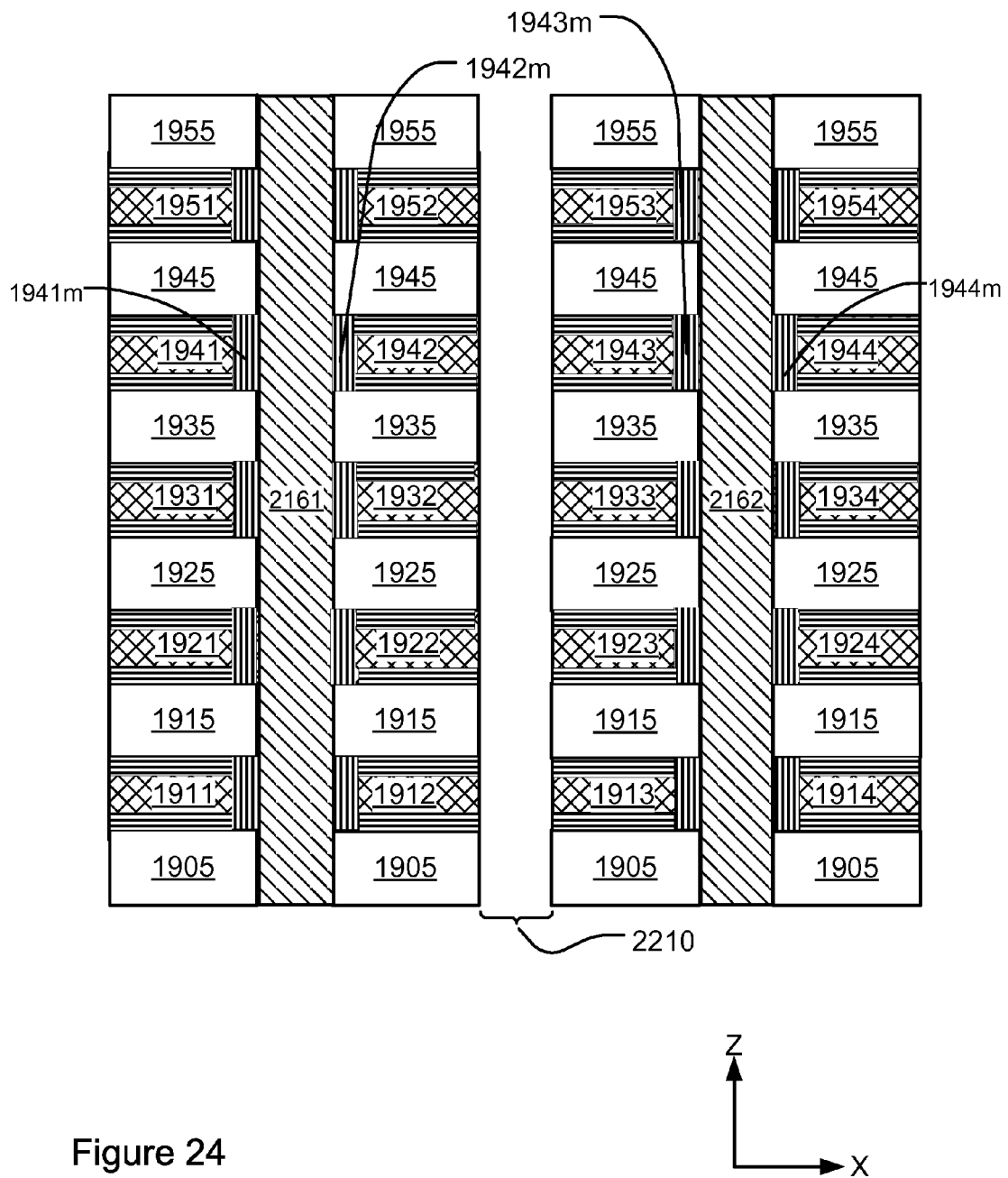

FIG. 24 illustrates a stage in the process after forming a memory layer (e.g. 1941*m*, 1942*m*, 1943*m*, 1944*m*) on side surfaces of the vertical active strips in the horizontal openings, and depositing a conductive material in the horizontal openings through the second openings (e.g. 2210) to form a plurality of planes of conductive strips (e.g. 1911-1914, 1921-1924, 1931-1934, 1941-1944, 1951-1954) in the horizontal openings. The conductive material can include TiN (titanium nitride) and W (tungsten). The plurality of planes includes a plurality of intermediate planes (WLs) of conductive strips (e.g. 1921-1924, 1931-1934, 1941-1944), a bottom plane (GSL) of conductive strips (e.g. 1911-1914), and a top plane (SSL) of conductive strips (e.g. 1951-1954). Side surfaces of conductive strips in the plurality of planes contact the memory layer. Conductive strips in the plurality of planes are in a Y-direction perpendicular to the X-Z plane.

Figure 25:
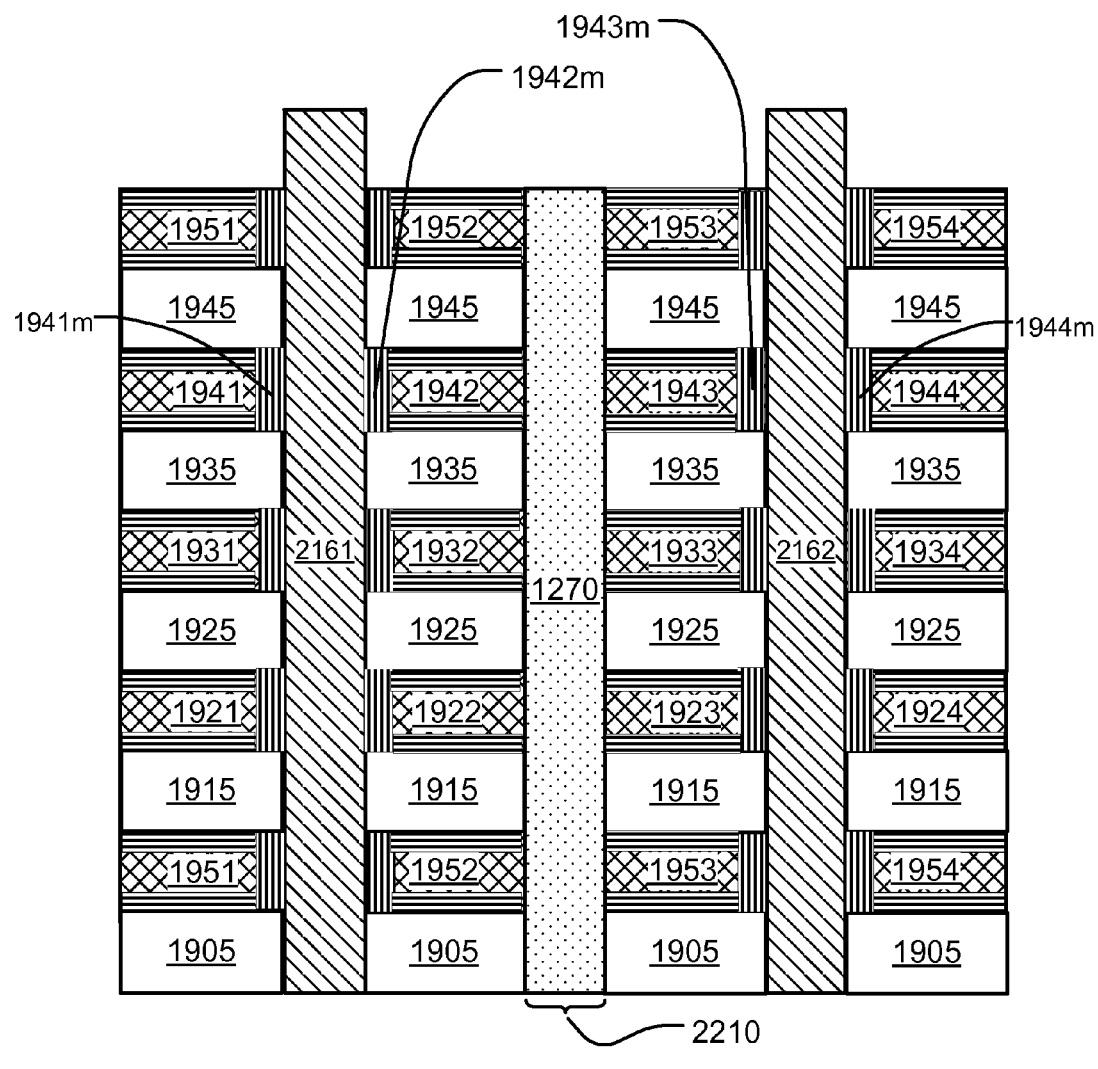

FIG. 25 illustrates a stage in the process after forming insulating material (e.g. 2570) in the second openings (e.g. 2210) and over a top insulating layer (e.g. 1955), and etching insulating material (e.g. 2570, 1955) to stop on the top plane of conductive strips (e.g. 1951-1954), and on top of the vertical active strips (e.g. 2161, 2162). At this stage in the process, a plurality of stacks of conductive strips is formed. Each stack of conductive strips includes a bottom plane (GSL) of conductive strips (e.g. 1911, 1912, 1913, 1914), a plurality of intermediate planes (WLs) of conductive strips (e.g. 1941, 1942, 1943, 1944), and a top plane (SSL) of conductive strips (e.g. 1951, 1952, 1953, 1954). The manufacturing process continues to complete a 3D memory array.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    a plurality of stacks of conductive strips alternating with insulating strips, at least one of the insulating strips comprising an insulating material with a dielectric constant equal to or lower than 3.6, the plurality of stacks of conductive strips including a plurality of intermediate planes of conductive strips arranged as word lines connected to a row decoder, the plurality of intermediate planes of conductive strips being disposed between a top plane of conducting strips in the stacks and a bottom plane of conducting strips in the stacks;
    a plurality of structures of a conductive material arranged orthogonally over the plurality of stacks; and
    memory elements in interface regions at cross-points between side surfaces of the plurality of stacks and the plurality of structures,
    wherein the insulating strips have non-simple spatial periods through the intermediate planes of conductive strips.

2. The memory device of claim 1, wherein the insulating strips have equivalent oxide thicknesses EOT substantially greater than their respective physical thicknesses, and alternate in thickness between a first equivalent oxide thickness and a second equivalent oxide thickness greater than the first equivalent oxide thickness through the intermediate planes of conductive strips.

3. The memory device of claim 2, wherein for insulating strips in the stack, the EOT is at least 10% greater than the respective physical thicknesses, and the second equivalent oxide thickness is greater than a thickness of the conductive strips.

4. The memory device of claim 1, wherein the insulating material is one or more of a group consisting of P-MSQ (polymethylsilsesquioxane), SiLK, fluorine-doped oxide, carbon-doped oxide, porous oxide, and spin-on organic polymeric dielectric.

5. The memory device of claim 1, wherein said at least one of the insulating strips consists essentially of said insulating material with a dielectric constant equal to or lower than 3.6.

6. The memory device of claim 1, including:
    a stack of linking elements separated by insulating layers, and connected to respective conductive strips in the stacks of conductive strips; and
    a plurality of interlayer connectors in the stack of linking elements extending from a connector surface to respective linking elements.

7. The memory device of claim 6, including patterned conductor lines on top of the connector surface and connected to respective interlayer connectors, the patterned conductor lines including a plurality of global bit lines coupled to sensing circuits, wherein conductive strips in the stacks of conductive strips include channels for the memory elements, and structures in the plurality of structures are arranged as word lines and string select lines including vertical gates for the memory elements.

8. The memory device of claim 6, including patterned conductor lines on top of the connector surface, connected to respective interlayer connectors, and coupled to decoding circuits, wherein conductive strips in the stacks of conductive strips are arranged as word lines and string select lines including gates for the memory elements, and structures in the plurality of structures are arranged as vertical channels for the memory elements.

9. The memory device of claim 1, wherein conductive strips in the stacks of conductive strips include un-doped poly silicon.

10. A memory device, comprising:
    a plurality of stacks of conductive strips alternating with insulating strips, at least one of the insulating strips comprising an insulating material with a dielectric constant equal to or lower than 3.6, the plurality of stacks of conductive strips including a plurality of intermediate planes of conductive strips arranged as word lines connected to a row decoder, the plurality of intermediate planes of conductive strips being disposed between a top plane of conducting strips in the stacks and a bottom plane of conducting strips in the stacks;
    a plurality of structures of a conductive material arranged orthogonally over the plurality of stacks; and
    memory elements in interface regions at cross-points between side surfaces of the plurality of stacks and the plurality of structures,
    wherein the memory elements include charge storage structures including one or more of a group consisting of ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), and wherein the insulating strips have non-simple spatial periods through the intermediate planes of conductive strips.

11. The memory device of claim 10, wherein said at least one of the insulating strips consists essentially of said insulating material with a dielectric constant equal to or lower than 3.6.

12. A method for manufacturing a memory device, comprising:

forming a plurality of conductive layers alternating with insulating layers on an integrated circuit substrate, at least one of the insulating layers comprising an insulating material with a dielectric constant equal to or lower than 3.6;

etching the plurality of layers to define a plurality of stacks of conductive strips alternating with insulating strips, the plurality of stacks of conductive strips including a plurality of intermediate planes of conductive strips arranged as word lines connected to a row decoder, the plurality of intermediate planes of conductive strips being disposed between a top plane of conducting strips in the stacks and a bottom plane of conducting strips in the stacks;

forming a memory layer on side surfaces of the conductive strips in the plurality of stacks;

forming a layer of a conductive material over the memory layer on the plurality of stacks; and etching the layer of the conductive material to define a plurality of structures of the conductive material arranged orthogonally over the plurality of stacks, wherein memory elements are disposed in interface regions at cross-points between side surfaces of the plurality of stacks and the plurality of structures, wherein the insulating strips have non-simple spatial periods through the intermediate planes of conductive strips.

13. The method of claim 12, wherein the insulating layers have equivalent oxide thicknesses EOT substantially greater than their respective physical thicknesses, and alternate in thickness between a first equivalent oxide thickness and a second equivalent oxide thickness greater than the first equivalent oxide thickness through the intermediate planes of conductive strips.

14. The method of claim 13, wherein for insulating strips in the stack, the EOT is at least 10% greater than the respective physical thicknesses.

15. The method of claim 12, wherein the insulating material is one or more of a group consisting of P-MSQ (polymethylsilsesquioxane), SiLK, fluorine-doped oxide, carbon-doped oxide, porous oxide, and spin-on organic polymeric dielectric.

16. The method of claim 12, wherein the plurality of conductive layers alternating with insulating layers has non-simple spatial periods through the conductive layers and insulating layers in the plurality.

17. The memory device of claim 12, wherein said at least one of the insulating layers consists essentially of said insulating material with a dielectric constant equal to or lower than 3.6.

18. The method of claim 12, including:

etching the plurality of layers to form a stack of linking elements separated by insulating layers, and connected to respective conductive strips in the stacks of conductive strips; and forming a plurality of interlayer connectors in the stack of linking elements extending from a connector surface to respective linking elements.

19. The method of claim 18, including:

forming patterned conductor lines on top of the connector surface and connected to respective interlayer connectors, the patterned conductor lines including a plurality of global bit lines coupled to sensing circuits, wherein conductive strips in the stacks of conductive strips include channels for the memory elements, and structures in the plurality of structures are arranged as word lines and string select lines including vertical gates for the memory elements.

20. The method of claim 18, including:

forming patterned conductor lines on top of the connector surface, connected to respective interlayer connectors, and coupled to decoding circuits, wherein conductive strips in the stacks of conductive strips are arranged as word lines and string select lines including gates for the memory elements, and structures in the plurality of structures are arranged as vertical channels for the memory elements.

21. The method of claim 12, wherein conductive strips in the plurality of stacks of conductive strips include un-doped poly silicon.

22. The method of claim 12, including:

forming a plurality of sacrificial layers, separated by the insulating layers on the integrated circuit substrate;

etching the sacrificial and the insulating layers to form first openings;

forming a plurality of vertical conductive strips in the first openings;

etching the sacrificial and the insulating layers to form second openings between adjacent vertical conductive strips in the plurality of vertical conductive strips, thereby exposing the plurality of sacrificial layers;

removing the plurality of sacrificial layers exposed by the second openings to form horizontal openings between the insulating layers;

forming a memory layer on side surfaces of the vertical conductive strips in the horizontal openings; and forming a plurality of planes of conductive strips in the horizontal openings, side surfaces of conductive strips in the plurality of planes contacting the memory layer.

* * * * *